United States Patent
Minami et al.

(10) Patent No.: US 10,077,504 B2
(45) Date of Patent: Sep. 18, 2018

(54) PLATING APPARATUS

(71) Applicant: EBARA CORPORATION, Tokyo (JP)

(72) Inventors: Yoshio Minami, Tokyo (JP); Ryuya Koizumi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 15/450,873

(22) Filed: Mar. 6, 2017

(65) Prior Publication Data
US 2017/0175285 A1 Jun. 22, 2017

Related U.S. Application Data

(62) Division of application No. 14/194,514, filed on Feb. 28, 2014, now Pat. No. 9,624,594.

(30) Foreign Application Priority Data

Mar. 4, 2013 (JP) .................................. 2013-041493

(51) Int. Cl.
| | |
|---|---|
| C23C 18/16 | (2006.01) |
| C25D 17/06 | (2006.01) |
| C25D 17/00 | (2006.01) |
| C25D 21/12 | (2006.01) |
| H01L 21/67 | (2006.01) |
| H01L 21/677 | (2006.01) |

(Continued)

(52) U.S. Cl.
CPC .......... *C25D 17/001* (2013.01); *C23C 18/163* (2013.01); *C23C 18/1628* (2013.01); *C23C 18/1632* (2013.01); *C23C 18/1675* (2013.01); *C25D 17/06* (2013.01); *C25D 21/12* (2013.01); *H01L 21/6723* (2013.01); *H01L 21/67751* (2013.01); *H01L 21/68721* (2013.01); *H01L 24/743* (2013.01); *H01L 24/83* (2013.01); *H01L 2924/0002* (2013.01)

(58) Field of Classification Search
None
See application file for complete search history.

(56) References Cited

U.S. PATENT DOCUMENTS

| | | |
|---|---|---|
| 5,976,198 A | 11/1999 | Suhara et al. |
| 6,171,403 B1 | 1/2001 | Kamikawa et al. |

(Continued)

FOREIGN PATENT DOCUMENTS

| | | |
|---|---|---|
| EP | 1229154 A1 | 8/2002 |
| JP | S58-011420 A | 1/1983 |

(Continued)

*Primary Examiner* — Binu Thomas
(74) *Attorney, Agent, or Firm* — Baker & Hostetler LLP

(57) ABSTRACT

A plating apparatus is described. The apparatus includes: a substrate holder configured to hold a substrate in a vertical position; at least one processing bath configured to process the substrate held by the substrate holder; a transporter configured to grip and horizontally transport the substrate holder; at least one lifter configured to receive the substrate holder from the transporter, lower the substrate holder to place the substrate holder in the processing bath, elevate the substrate holder from the processing bath after processing of the substrate, and transfer the substrate holder to the transporter; and a controller configured to control operations of the transporter and the lifter.

6 Claims, 20 Drawing Sheets

(51) Int. Cl.
*H01L 21/687* (2006.01)
*H01L 23/00* (2006.01)

(56) References Cited

U.S. PATENT DOCUMENTS

| | | | |
|---|---|---|---|
| 2004/0037682 A1* | 2/2004 | Yoshioka | C25D 17/06 414/458 |
| 2008/0245669 A1 | 10/2008 | Yoshioka et al. | |
| 2011/0172800 A1 | 7/2011 | Koizumi et al. | |
| 2012/0100709 A1* | 4/2012 | Minami | C25D 17/00 118/423 |
| 2013/0122704 A1 | 5/2013 | Kanda et al. | |

FOREIGN PATENT DOCUMENTS

| | | | |
|---|---|---|---|
| JP | 07-299427 A | | 11/1995 |
| JP | 2528942 | * | 8/1996 |
| JP | 2528942 B2 | | 8/1996 |
| JP | 2004-076022 A | | 3/2004 |
| JP | 2004-076072 A | | 3/2004 |
| JP | 3979847 | | 7/2007 |
| JP | 2012-107311 A | | 6/2012 |
| JP | 2013-011011 A | | 1/2013 |

* cited by examiner

PLATING APPARATUS

CROSS REFERENCE TO RELATED APPLICATION

This document is a Divisional Application of U.S. application Ser. No. 14/194,514, filed on Feb. 28, 2014, which claims priority to Japanese Application Number 2013-041493 filed Mar. 4, 2013, the entire contents of which are hereby incorporated by reference.

BACKGROUND OF THE INVENTION

Field of the Invention

The present invention relates to a plating apparatus for plating a surface of a substrate, such as a semiconductor wafer, and more particularly to a plating apparatus for forming a metal film in fine interconnect trenches, plugs, or resist openings provided on a surface of a substrate, such as a semiconductor wafer, or for forming bumps (extruding electrodes), which electrically interconnect a semiconductor chip and a substrate, on a surface of a semiconductor wafer.

Description of the Related Art

It is a common practice in TAB (tape automated bonding) or flip chip to form protruding connection electrodes (i.e., bumps) of gold, copper, solder or nickel, or of multiple layers of such metals at predetermined portions (electrodes) of a surface of a semiconductor chip having interconnects formed therein so that the semiconductor chip can be electrically coupled via the bumps to substrate electrodes or TAB electrodes. There are various methods usable for forming the bumps, such as electroplating, vapor deposition, printing, and ball bumping. In recent years, electroplating, which can form fine bumps and can be performed in a relatively stable manner, has been widely used, as the number of I/O in a semiconductor chip increases and the electrode pitch becomes smaller.

The electroplating method can be classified roughly into a jet method (or a cup method) and a dip method. According to the jet method, a substrate, such as a semiconductor wafer, is held in a horizontal position with a surface, to be plated, facing downward, and a plating solution is jetted upward onto the surface to be plated. According to the dip method, a substrate is held in a vertical position in a plating bath and a plating solution is injected upward into the plating bath, while the plating solution overflows the plating bath during plating. Electroplating using the dip method has advantages of a small footprint and good release of bubbles which could adversely affect a quality of plating. Moreover, the electroplating using the dip method can be easily applied to a variety of wafer sizes. Therefore, the dip method is considered suitable for bump plating in which plating is performed on relatively large-sized holes and which requires a considerably long plating time.

The applicant has proposed a plating apparatus which uses the dip method with relatively good release of bubbles and which, in order to enable automatic formation of a metal film suited for protruding electrodes such as bumps, includes a substrate holder for holding a substrate in a vertical position, a plurality of processing baths for immersing the substrate, held by the substrate holder, in a processing liquid to process the substrate, and a vertically movable transporter (substrate holder transport device) for gripping the substrate holder holding the substrate, transporting the substrate holder in a horizontal direction, and immersing the substrate holder, holding the substrate, in a processing liquid in any one of the processing baths (see Japanese Patent No. 3,979,847 and Japanese Patent Laid-Open Publication No. 2012-107311).

The applicant has further proposed a plating apparatus which includes a substrate holder for holding a substrate in a vertical position, a plating unit having a plating bath for immersing the substrate, held by the substrate holder, in a plating solution to process the substrate, a substrate transport device for transporting the substrate and transferring the substrate to the substrate holder, and a vertically moving mechanism for lowering the substrate holder, holding the substrate, and immersing it in the plating solution (see Japanese Patent Laid-Open Publication No. 2004-76072).

Further, a cleaning apparatus has been proposed which includes a workpiece carrier for holding a plurality of workpieces in a vertical position, a plurality of processing baths for holding a processing liquid in which the workpieces, held by the workpiece carrier, are to be immersed for processing of the workpieces, and a workpiece transport means. The workpiece transport means includes a lateral workpiece transport mechanism for transporting the workpiece carrier, holding the workpieces, in a lateral direction, and a workpiece lifting mechanism for receiving the workpieces from the lateral workpiece transport mechanism, and lowering the workpieces and immersing them in a processing liquid in any one of the processing baths (see Japanese Patent Laid-Open Publication No. 7-299427).

In the apparatus disclosed in Japanese Patent No. 3,979,847 and Japanese Patent Laid-Open Publication No. 2012-107311, the transporter grips the substrate holder holding a substrate, moves the substrate holder horizontally to a position just above a processing bath, and lowers the substrate holder and immerses it in a processing liquid in the processing bath. After the completion of processing of the substrate, the substrate holder is raised and drawn out of the processing liquid. Thus, the transporter must stay in the position above the processing bath when raising and lowering the substrate holder, thus resulting in an increased takt time and a decreased throughput.

The takt time also increases, for example, (1) when the types of processing baths increase with an increase in the types of plating solutions as in the case of multi-layer plating, and therefore a substrate holder holding a substrate is raised/lowered by a transporter an increased number of times, or (2) when the speed of raising/lowering of a substrate holder by means of a transporter is decreased, in particular, when a substrate holder holding a substrate is lowered and immersed in a processing liquid at a slower speed in order to prevent splashing of the processing liquid or when a substrate holder holding a processed substrate is raised and drawn out of a processing liquid at a slower speed in order to better drain the processing liquid from the substrate holder.

It may be necessary in such cases to install a plurality of transporters. However, if a plurality of transporters are installed, it is necessary to avoid contact between the transporters. In addition, it takes a lot of time to transfer a substrate holder between transporters.

In particular, two transporters, depending on their sizes, may interfere with each other when they move to two adjacent processing baths and may not be capable of simultaneously raising/lowering substrate holders in the two adjacent processing baths. In order to transfer a substrate holder directly between the transporters, these transporters necessary have a complicated structure. When transferring a substrate holder between conventional transporters, one transporter should place a substrate holder on a processing bath or on a receiver once, and another transporter should grip the substrate holder on the processing bath or the receiver.

As described above, a conventional transporter moves a substrate holder horizontally above processing baths, and lowers and raises the substrate holder in each of the processing baths. The horizontal movement and lowering/raising of the substrate holder require a considerable amount of time. Therefore, an increase in the frequency of transport of the substrate holder by the transporter(s), due to an increase in the number of processing baths or the number of process steps, may cause an increase in the takt time and a decrease in the throughput.

SUMMARY OF THE INVENTION

The present invention has been made in view of the above situation. It is therefore an object of the present invention to provide a plating apparatus which can reduce a takt time and increase a throughput even if there is an increase in the number of processing baths or the number of process steps.

In an embodiment, a plating apparatus includes: a substrate holder configured to hold a substrate in a vertical position; at least one processing bath configured to process the substrate held by the substrate holder; a transporter configured to grip the substrate holder, holding the substrate, and horizontally transport the substrate holder; at least one lifter configured to receive the substrate holder, holding the substrate, from the transporter, lower the substrate holder to place the substrate holder in the processing bath, elevate the substrate holder from the processing bath after processing of the substrate, and transfer the substrate holder to the transporter; and a controller configured to control operations of the transporter and the lifter.

In an embodiment, the at least one processing bath comprises a plurality of processing baths, the at least one lifter comprises a plurality of lifters, and the plurality of lifters are provided for the plurality of processing baths, respectively.

In an embodiment, the at least one processing bath comprises a plurality of processing baths, at least one of the plurality of processing baths has a plurality of cells for performing common processing of the substrate, and the lifter includes an elevating actuator configured to vertically move the substrate holder, and a laterally-moving actuator configured to horizontally move the elevating actuator between the plurality of cells.

In an embodiment, the controller is configured to control a timing of starting an operation of the lifter such that the lifter stops elevating the substrate holder at the same time as the transporter reaches the processing bath when the lifter transfers the substrate holder to the transporter.

In an embodiment, the controller is configured to control a timing of starting an operation of the lifter such that the lifter reaches a standby position and stays there before the transporter, griping the substrate holder, reaches the processing bath when the transporter transfers the substrate holder to the lifter.

In an embodiment, a plating apparatus includes: substrate holders each configured to hold a substrate in a vertical position; a processing bath configured to process the substrate held by each of the substrate holders; a transporter configured to grip and horizontally transport one of the substrate holders; a storage unit configured to store the substrate holders therein; and a lifter configured to elevate one of the substrate holders stored in the storage unit and transfer the substrate holder to the transporter. The lifter includes an elevating actuator configured to vertically move one of the substrate holder, and a laterally-moving actuator configured to horizontally move the elevating actuator between a plurality of substrate holder storage positions in the storage unit.

In an embodiment, a plating apparatus includes: a substrate holder configured to hold a substrate in a vertical position; a processing bath configured to process the substrate held by the substrate holder; a transporter configured to grip the substrate holder and horizontally transport the substrate holder; and a substrate-holder tilting mechanism configured to transfer and receive the substrate holder to and from the transporter. The substrate-holder tilting mechanism is configured to convert the substrate holder from a vertical position to a horizontal position by lowering a support member that rotatably supports the substrate holder, and convert the substrate holder from the horizontal position to the vertical position by elevating the support member.

According to the plating apparatus as described above, the substrate holder, holding a substrate, is horizontally transported by the transporter, while the substrate holder is vertically moved by the lifter which is provided separately from the transporter. The vertical movement of the substrate holder can be performed independently of and in parallel with the horizontal transport of another substrate holder. This structure can reduce a time it takes for the transporter to transport the substrate holder. Therefore, it becomes possible to reduce a takt time and increase a throughput even if there is an increase in the number of processing baths or the number of process steps.

DETAILED DESCRIPTION

Figure 1:
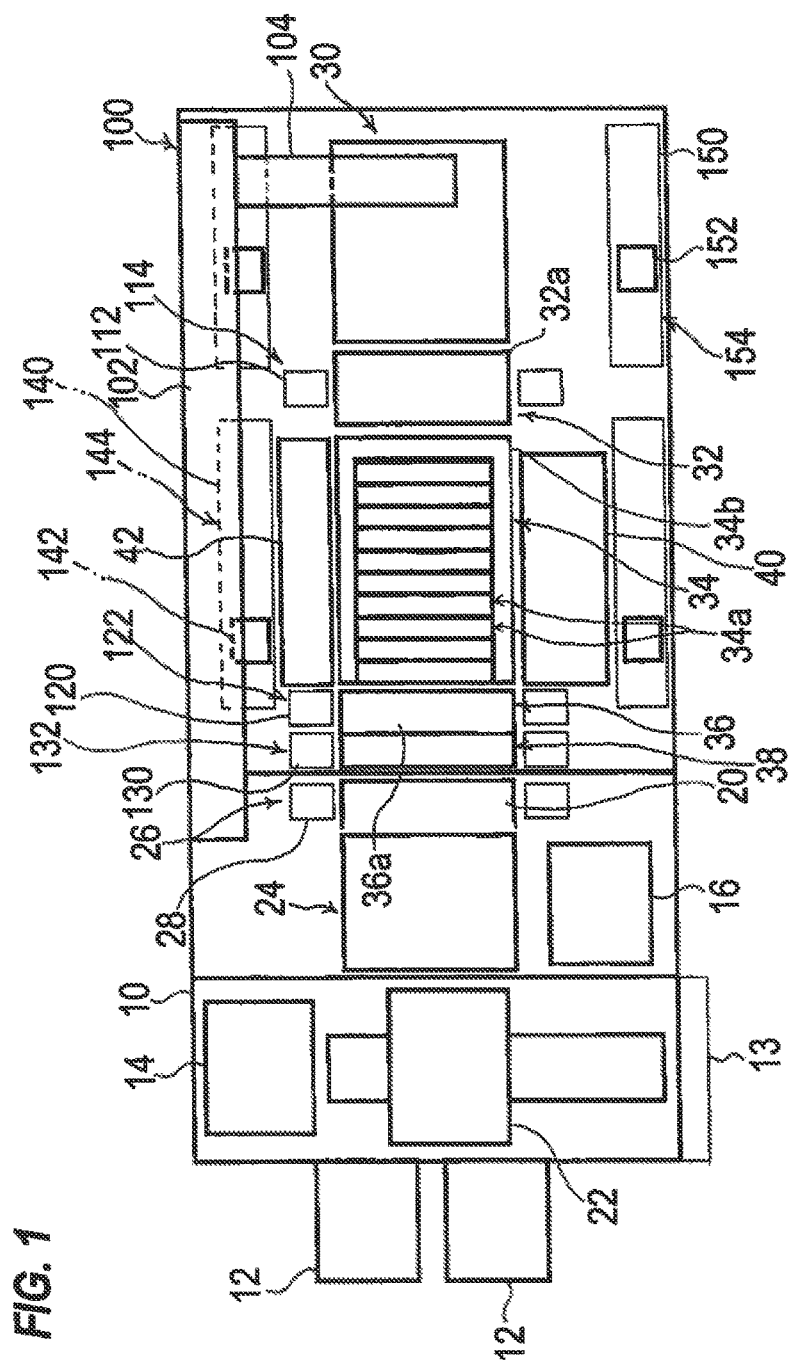
FIG. 1 is an overall layout plan view of a plating apparatus according to an embodiment.
Figure 2:
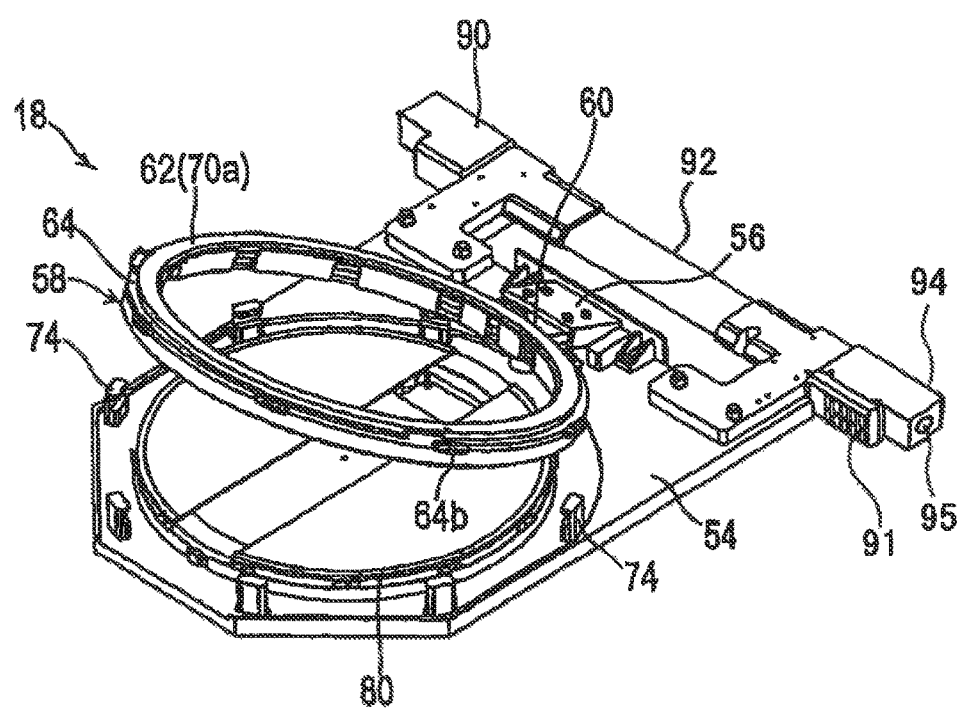
FIG. 2 is a perspective view of a substrate holder.

Embodiments will now be described in detail with reference to the drawings. Identical or corresponding elements are denoted by the same reference numerals and duplicate descriptions thereof are omitted.

FIG. 1 shows an overall layout plan view of a plating apparatus according to an embodiment. As shown in FIG. 1, the plating apparatus includes a frame 10, two load ports 12 each receiving thereon a cassette in which substrates, such as wafers, are stored, and a controller configured to control operations of units. In the frame 10, there are disposed an aligner 14 for aligning an orientation flat or a notch of a substrate with a predetermined direction, a spin-rinse drier (SRD) 16 for rotating a plated substrate at a high speed to dry the substrate, and a table 20 on which a substrate holder (see FIG. 2 through FIG. 5) in a horizontal position. Further, a substrate transfer robot 22 is provided for transporting the substrate between these units.

A substrate-holder opening and closing mechanism 24 is disposed above the table 20. This substrate-holder opening and closing mechanism 24 is configured to open and close the substrate holder 18 that is placed on the table 20 to load and unload the substrate holder 18 with a substrate. A substrate-holder tilting mechanism 26, which is configured to raise the substrate holder 18 up and lay it down, is disposed beside the table 20.

In the interior of the frame 10, there are provided a storage unit 30 for storing or temporarily placing substrate holders 18 therein, a precleaning bath 32 for precleaning (pretreating) the substrate, held by the substrate holder 18, with a pretreatment liquid, such as pure water, a plating bath 34 for plating the substrate held by the substrate holder 18, a rinsing bath 36 for rinsing the plated substrate, together with the substrate holder 18, with rinsing water, and a blow bath 38 for draining water from the rinsed substrate. The storage unit 30, the precleaning bath 32, the plating bath 34, the rinsing bath 36, and the blow bath 38 are arranged in this order from the opposite side of the substrate-holder tilting mechanism 26.

In this embodiment, the precleaning bath 32 has one precleaning cell 32a for holding the pretreatment liquid, such as pure water, therein. The plating bath 34 has a plurality of (e.g., 10 in this embodiment) plating cells 34a for holding a plating solution therein, and further has an overflow bath 34b. The rinsing bath 36 has one rinsing cell 36a for holding a rinsing liquid therein. The plating cells 34a are, for example, electroplating cells each provided with an anode electrode. The substrate holder 18, holding a substrate, is placed in each plating cell 34a when electroplating of the substrate is performed. Alternatively, the plating cells 34a may be electroless plating cells for performing electroless plating of a substrate.

In this embodiment the plating bath 34 uses a single type of plating solution and is configured to allow the plating solution to overflow each plating cell 34a into the common overflow bath 34b. The storage unit 30 is configured to hold a plurality of parallel substrate holders 18 in a vertical position. The blow bath 38 is configured to blow air onto the substrate held by the substrate holder 18 to remove liquid droplets from the surface of the substrate to thereby dry the substrate surface.

A paddle motor unit 40 for driving a paddle (not shown) for agitating the plating solution in each plating cell 34a is provided on one side of the plating bath 34. An exhaust duct 42 is provided on the other side of the plating bath 34.

As shown in FIGS. 2 through 5, the substrate holder 18 includes a first holding member (or a base holding member) 54 having a rectangular plate shape and made of e.g., vinyl chloride, and a second holding member (or a movable holding member) 58 rotatably coupled to the first holding member 54 through a hinge 56 which allows the second holding member 58 to open and close with respect to the first holding member 54.

While the second holding member 58 is configured to be openable and closable through the hinge 56 in this embodiment, it is also possible to dispose the second holding member 58 opposite to the first holding member 54 and to move the second holding member 58 away from and toward the first holding member 54 to thereby open and close the second holding member 58.

The second holding member 58 includes a base portion 60 and a ring-shaped seal holder 62. The seal holder 62 is made of vinyl chloride so as to enable a retaining ring 64, which will be described later, to slide well. An annular substrate-side sealing member 66 is fixed to an upper portion of the seal holder 62. This substrate-side sealing member 66 is placed in pressure contact with a periphery of the surface of the substrate W to seal a gap between the substrate W and the second holding member 58 when the substrate W is held by the substrate holder 18. An annular holder-side sealing member 68 is fixed to a surface, facing the first holding member 54, of the seal holder 62. This holder-side sealing member 68 is placed in pressure contact with the first holding member 54 to seal a gap between the first holding member 54 and the second holding member 58 when the substrate W is held by the substrate holder 18. The holder-side sealing member 68 is located at the outer side of the substrate-side sealing member 66.

Figure 5:
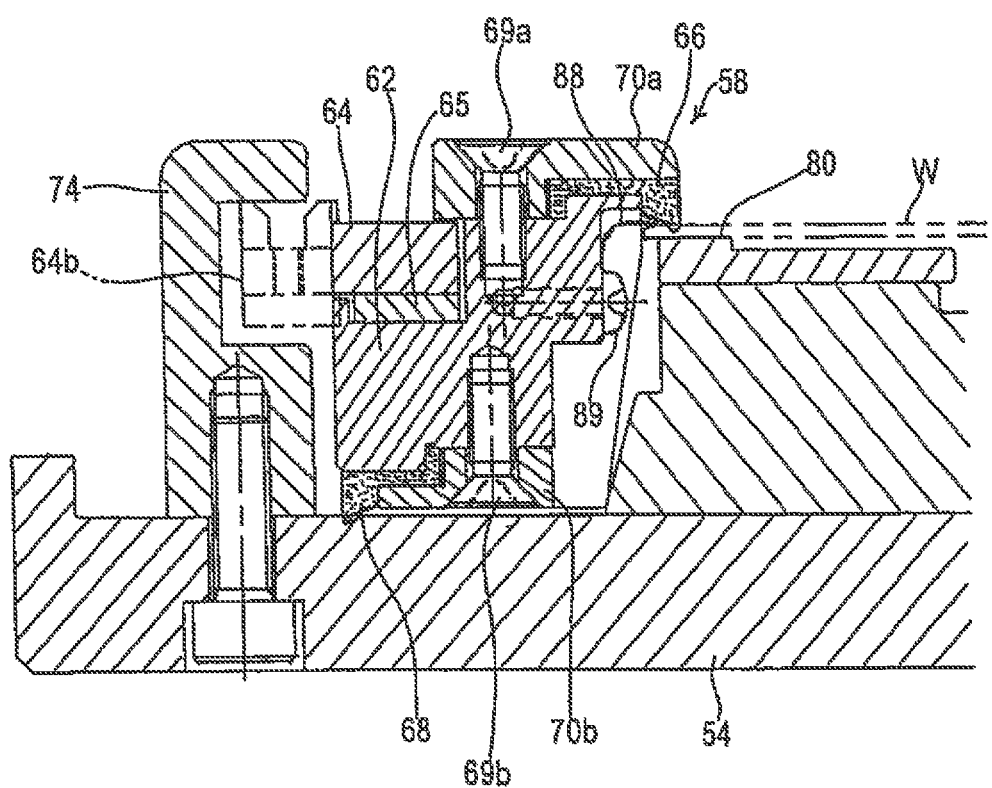
FIG. 5 is an enlarged view of the portion A shown in FIG. 4.

As shown in FIG. 5, the substrate-side sealing member 66 is sandwiched between the seal holder 62 and a first mounting ring 70a, which is secured to the seal holder 62 by fastening tools 69a, such as screws. The holder-side sealing member 68 is sandwiched between the seal holder 62 and a second mounting ring 70b, which is secured to the seal holder 62 by fastening tools 69b, such as screws.

The seal holder 62 has a stepped portion at a periphery thereof, and the retaining ring 64 is rotatably mounted to the stepped portion through a spacer 65. The retaining ring 64 is inescapably held by an outer peripheral portion of the first mounting ring 70a. This retaining ring 64 is made of a material (e.g., titanium) having high rigidity and excellent acid and alkali corrosion resistance and the spacer 65 is made of a material having a low friction coefficient, for example PTFE, so that the retaining ring 64 can rotate smoothly.

Inverted L-shaped clampers 74, each having an inwardly projecting portion and located at the outer side of the retaining ring 64, are provided on the first holding member 54 at equal intervals along a circumferential direction of the retaining ring 64. The retaining ring 64 has, on its outer circumferential surface, outwardly projecting portions 64*b* arranged at positions corresponding to positions of the clampers 74. A lower surface of the inwardly projecting portion of each clamper 74 and an upper surface of each projecting portion 64*b* of the retaining ring 64 are inclined in opposite directions along the rotational direction of the retaining ring 64. A plurality (e.g., three) of upwardly projecting protrusions 64*a* are provided on the retaining ring 64 at predetermined positions along the circumferential direction of the retaining ring 64. The retaining ring 64 can be rotated by pushing and moving each protrusion 64*a* from a lateral direction by means of a rotating pin (not shown).

With the second holding member 58 open, the substrate W is inserted into the central portion of the first holding member 54, and the second holding member 58 is then closed through the hinge 56. Subsequently the retaining ring 64 is rotated clockwise so that each projecting portion 64*b* of the retaining ring 64 slides into the inwardly projecting portion of each clamper 74. As a result, the first holding member 54 and the second holding member 58 are fastened to each other and locked by engagement between the inclined surfaces of the retaining ring 64 and the inclined surfaces of the clampers 74. The lock of the second holding member 58 can be released by rotating the retaining ring 64 counterclockwise to disengage the projecting portions 64*b* of the retaining ring 64 from the inverted L-shaped clampers 74.

When the second holding member 58 is locked in the above-described manner, the downwardly-protruding portion of the substrate-side sealing member 66 is placed in pressure contact with the periphery of the surface of the substrate W. The substrate-side sealing member 66 is pressed uniformly against the substrate W to thereby seal the gap between the periphery of the surface of the substrate W and the second holding member 58. Similarly, when the second holding member 58 is locked, the downwardly-protruding portion of the holder-side sealing member 68 is placed in pressure contact with the surface of the first holding member 54. The sealing holder-side sealing member 68 is uniformly pressed against the first holding member 54 to thereby seal the gap between the first holding member 54 and the second holding member 58.

A protruding portion 82 is formed on the upper surface of the first holding member 54 so as to protrude in a ring shape with a size corresponding to a size of the substrate W. The protruding portion 82 has an annular support surface 80 which contacts a periphery of the substrate W to support the substrate W. The protruding portion 82 has recesses 84 arranged at predetermined positions along a circumferential direction of the protruding portion 82.

Figure 3:
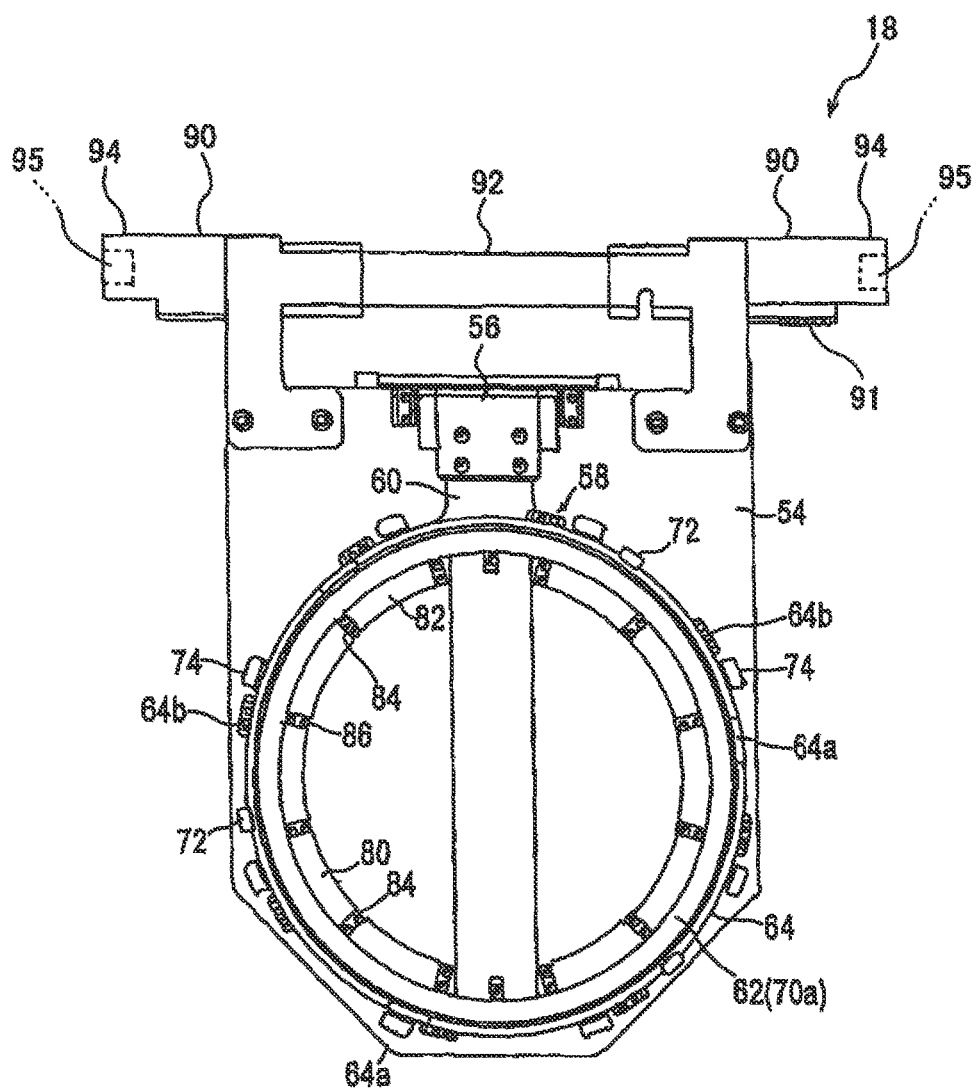
FIG. 3 is a plan view of the substrate holder shown in FIG. 2.
Figure 4:
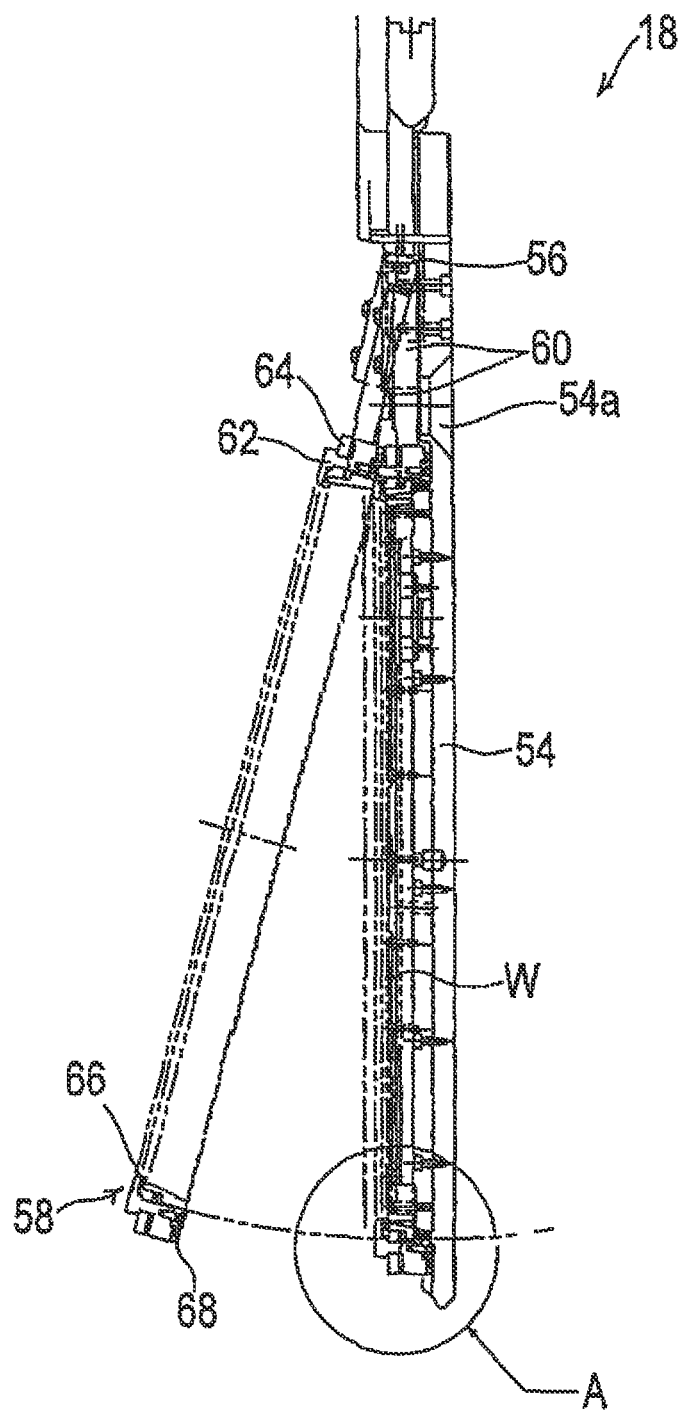
FIG. 4 is a right side view of the substrate holder shown in FIG. 2.

As shown in FIG. 3, a plurality of (e.g., 12 as illustrated) electrical conductors (electrical contacts) 86 are disposed in the recesses 84, respectively. These electrical conductors 86 are coupled respectively to wires extending from external contacts 91 provided on a first step portion 90 of a holder hanger. When the substrate W is placed on the support surface 80 of the first holding member 54, end portions of the electrical conductors 86 spring out around the substrate W to resiliently contact lower portions of electrical contacts 88 shown in FIG. 5.

The electrical contacts 88, which are to be electrically connected to the electrical conductors 86, are secured to the seal holder 62 of the second holding member 58 by fastening tools 89, such as screws. Each of the electrical contacts 88 has a leaf spring-like contact portion located at the outer side of the substrate-side sealing member 66 and projecting inwardly. This spring-like contact portion is springy and bends easily. When the substrate W is held by the first holding member 54 and the second holding member 58, the contact portions of the electrical contacts 88 come into elastic contact with the peripheral surface of the substrate W supported on the support surface 80 of the first holding member 54.

The second holding member 58 is opened and closed by a not-shown pneumatic cylinder and by a weight of the second holding member 58 itself. More specifically, the first holding member 54 has a through-hole 54*a*, and a pneumatic cylinder is provided so as to face the through-hole 54*a* when the substrate holder 18 is placed on the table 20. The second holding member 58 is opened by extending a piston rod of the pneumatic cylinder through the through-hole 54*a* to push up the seal holder 62 of the second holding member 58 through a pushing rod. The second holding member 58 is closed by its own weight when the piston rod is retracted.

A pair of holder hangers are provided on the end portions of the first holding member 54. The holder hangers have first step portions 90 and second step portions 94, which project outwardly and serve as support portions when the substrate holder 18 is transported and when the substrate holder 18 is held in a suspended state. A hand lever 92 extends between the first step portions 90 on both sides. In the storage unit 30, the first step portions 90 are placed on an upper surface of a peripheral wall of the storage unit 30, whereby the substrate holder 18 is suspended in a vertical position. Also in the precleaning bath 32, the plating bath 34, the rinsing bath 36, and the blow bath 38, the substrate holder 18 is suspended from peripheral walls of these baths, with the first step portions 90 placed on the peripheral walls.

Referring back to FIG. 1, a transporter 100, which may be of linear motor type, is provided beside the storage unit 30, the precleaning bath 32, the plating bath 34, the rinsing bath 36, the blow bath 38, and the substrate-holder tilting mechanism 26. The transporter 100 is configured to transport the substrate holder 18, together with a substrate, between these unit and baths. The transporter 100 includes a fixed base 102 fixed to the frame 10 and extending horizontally, and a laterally-moving arm 104 that moves horizontally along the fixed base 102. The transporter 100 is configured to move the laterally-moving arm 104 horizontally at a relatively low speed when the arm 104 holds the substrate holder 18 and to move the laterally-moving arm 104 horizontally at a relatively high speed when the arm 104 does not hold the substrate holder 18.

Figure 6:
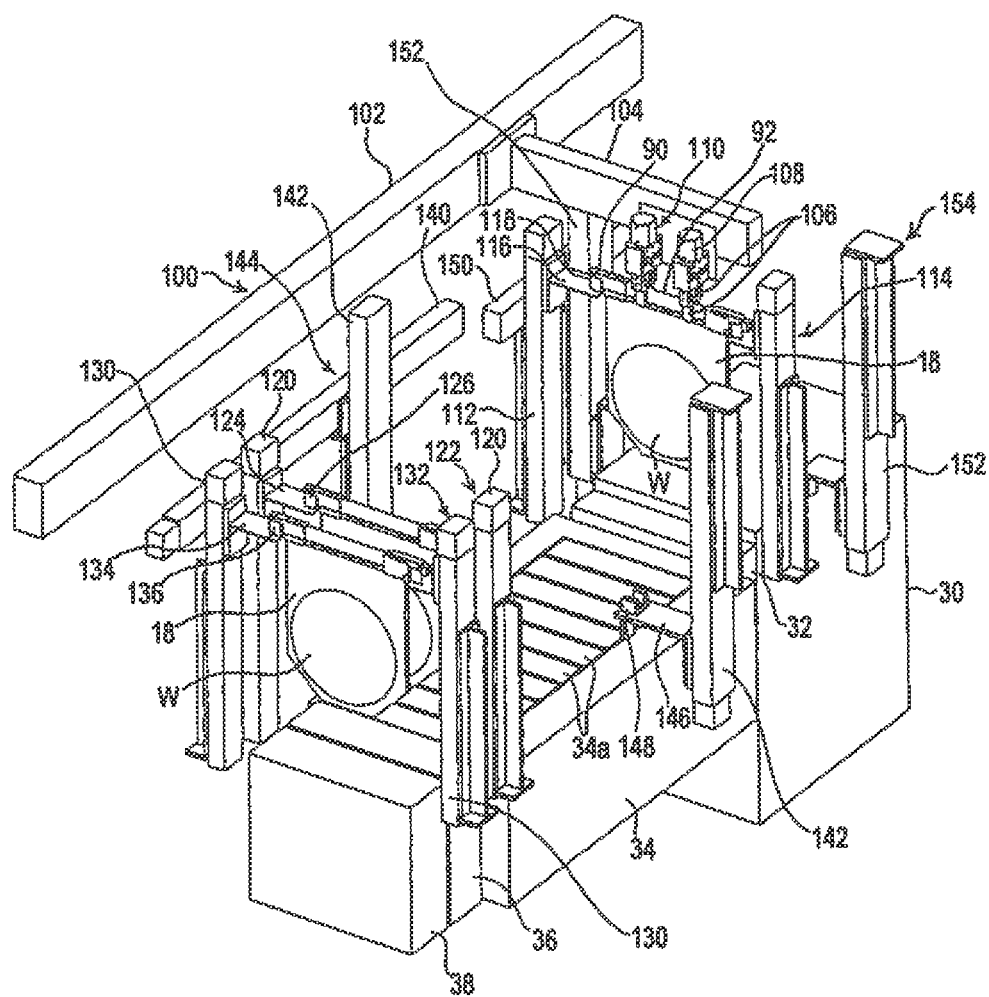
FIG. 6 is a perspective view of a main portion of the plating apparatus shown in FIG. 1.
Figure 7:
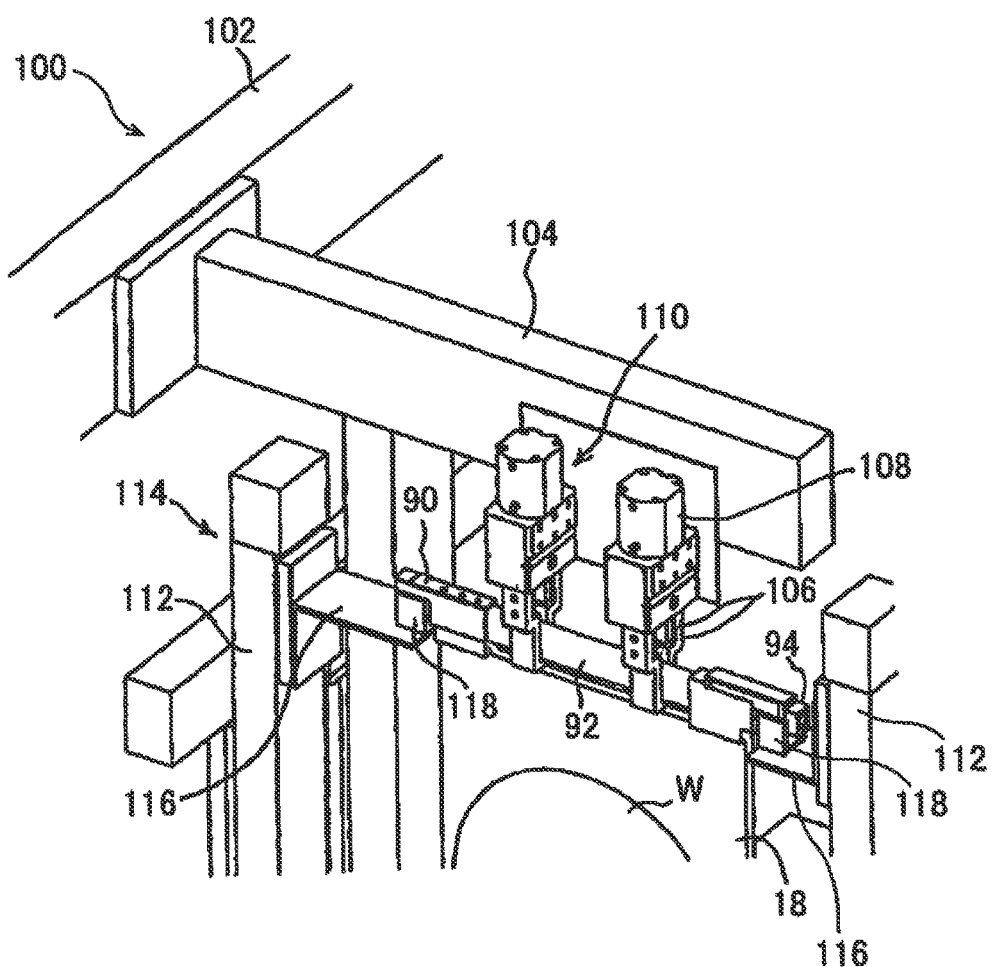
FIG. 7 is an enlarged view of a part of FIG. 6.

As shown in detail in FIGS. 6 and 7, the laterally-moving arm 104 is provided with a gripping mechanism 110. This gripping mechanism 110 has two pairs of chuck claws 106 for gripping (nipping) the hand lever 92 of the substrate holder 18, and a pair of actuators 108 each for moving the pair of chuck claws 106 in directions closer to and away from each other.

The precleaning bath 32 having the one precleaning cell 32*a* is provided with a precleaning-bath immovable lifter 114, which includes a pair of actuators 112 installed upright at both sides of the precleaning bath 32. The actuators 112 are each secured to the frame 10 through a bracket. As shown in FIGS. 6 and 7, lifting arms 116 that move vertically along the actuators 112 are coupled to the actuators 112, respectively. Each lifting arm 116 can move vertically by a motor and a ball screw of the actuator 112 installed therein. Open-top receivers 118, each having a rectangular vertical section (having a bottom portion and a pair of opposing side portions), are secured to the lifting arms 116, respectively. The first step portions 90 of the holder hanger of the substrate holder 18, holding a substrate W, are inserted into the receivers 118, respectively, whereby the substrate holder 18 is supported by the precleaning-bath immovable lifter 114. The substrate holder 18 is elevated and lowered by the actuators 112.

Similarly, the rinsing bath 36 having the one rinsing cell 36a is provided with a rinsing-bath immovable lifter 122, which includes a pair of actuators 120 installed upright at both sides of the rinsing bath 36. As shown in FIG. 6, lifting arms 124 are coupled to the actuators 120, respectively, so that the lifting arms 124 are elevated and lowered by the actuators 120. Open-top receivers 126, each having a rectangular vertical section, are secured to the lifting arms 124, respectively. The blow bath 38 is provided with a blow-bath immovable lifter 132, which includes a pair of actuators 130 installed upright at both sides of the blow bath 38. As shown in FIG. 6, lifting arms 134 are coupled to the actuators 130, respectively, so that the lifting arms 134 are elevated and lowered by the actuators 130. Open-top receivers 136, each having a rectangular vertical section, are secured to the lifting arms 134, respectively.

The plating bath 34 having the plurality of plating cells 34a is provided with a plating-bath movable lifter 144. This plating-bath movable lifter 144 includes a pair of laterally-moving actuators 140 secured to the frame 10 and disposed at both sides of the plating bath 34, and a pair of vertically-extending elevating actuators 142 which are moved horizontally by the laterally-moving actuators 140. In FIG. 6, one of the laterally-moving actuators 140 (the nearer one) is not shown for making it easier to see the drawing. Lifting arms 146 are coupled to the elevating actuators 142, respectively, so that the lifting arms 146 are elevated and lowered by the elevating actuators 142. Open-top receivers 148, each having a rectangular vertical section, are secured to the lifting arms 146, respectively. The second step portions 94 of the holder hanger of the substrate holder 18, holding a substrate W, are inserted into the receivers 148, respectively, whereby the substrate holder 18 is supported by the plating-bath movable lifter 144. The substrate holder 18 is elevated and lowered by the elevating actuators 142.

The storage unit 30 is provided with a storage-unit movable lifter 154 having a construction similar to that of the above-described movable lifter 144 for the plating bath 34. The storage-unit movable lifter 154 includes a pair of laterally-moving actuators 150 secured to the frame 10 and disposed at both sides of the storage unit 30, and a pair of vertically-extending elevating actuators 152 which are moved horizontally by the laterally-moving actuators 150. In FIG. 6, one of the laterally-moving actuators 150 is not shown. Lifting arms (not shown) are coupled to the elevating actuators 152 and receivers (not shown) are secured to the lifting arms, so that these lifting arms and receivers move up and down.

In this embodiment the transporter 100 simply functions to grip the substrate holder 18, holding a substrate W, and to move the substrate holder 18 horizontally, while the immovable lifters 114, 122, 132 and the movable lifters 144, 154 function to vertically move the substrate holder 18 which has been received from the transporter 100.

Figure 8:
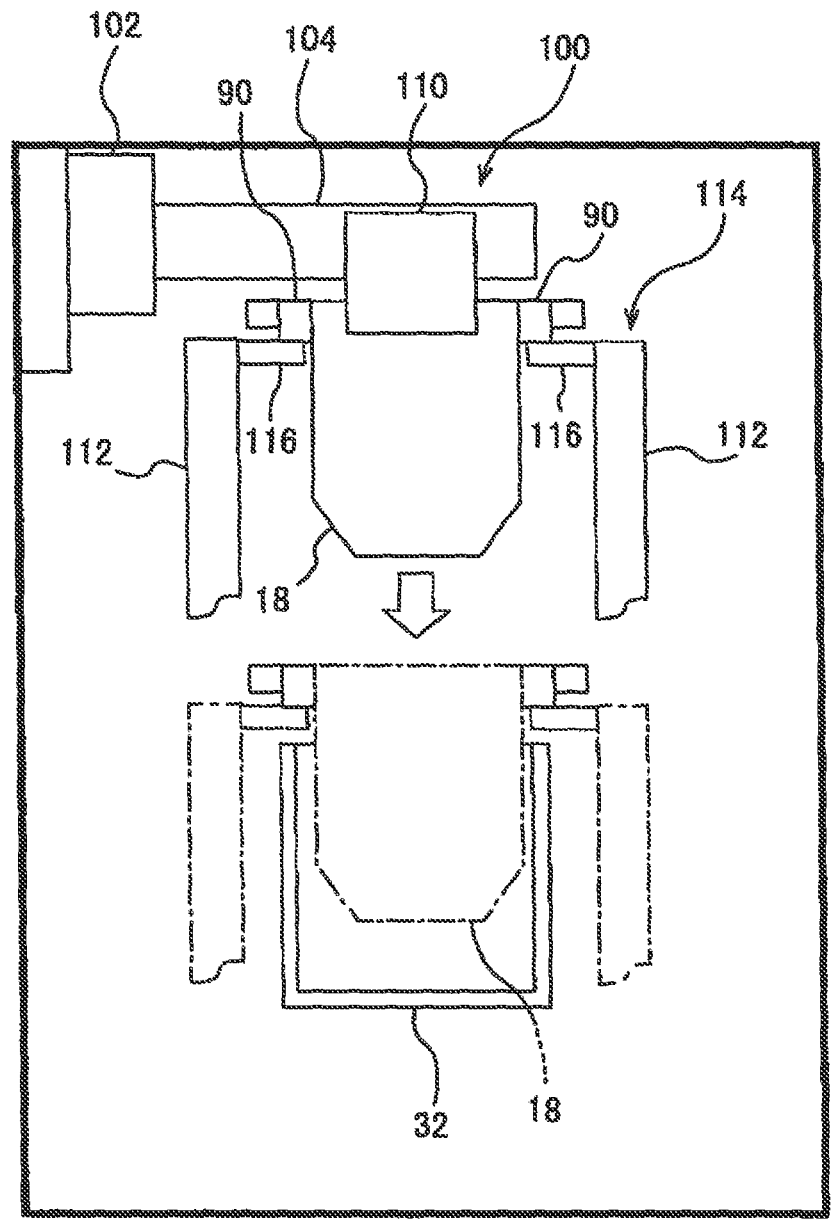
FIG. 8 is a diagram illustrating a transporter when transferring a substrate holder to a precleaning-bath immovable lifter.
Figure 9:
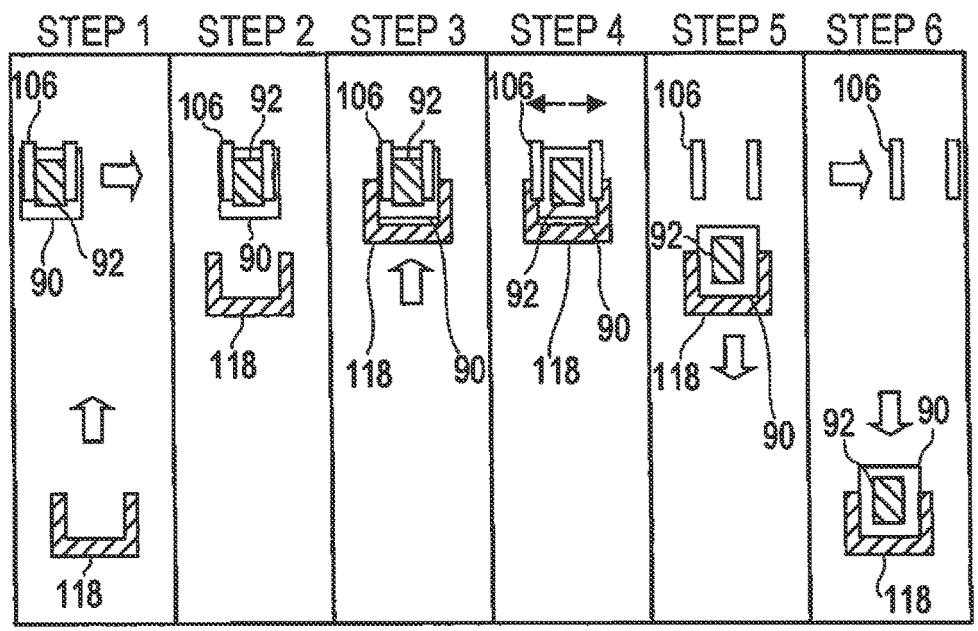
FIG. 9 is a schematic diagram illustrating an operational process of transferring the substrate holder, holding the substrate, from the transporter to the precleaning-bath immovable lifter and placing the substrate holder at a predetermined position in a precleaning bath.

An operational process of transferring the substrate holder 18, holding a substrate W, from the transporter 100 to the immovable lifter 114 for the precleaning bath 32 and placing the substrate holder 18 at a predetermined position in the precleaning bath 32 will now be described with reference to FIGS. 8 and 9. In FIG. 8, the receivers 118 are not shown to simplify the drawing. FIG. 9 schematically shows only the first step portion 90 and the hand lever 92 of the holder hanger of the substrate holder 18, the chuck claws 106 of the transporter 100, and one of the receivers 118 of the precleaning-bath immovable lifter 114.

First, as shown in step 1 of FIG. 9, the receivers 118 of the precleaning-bath immovable lifter 114 are elevated, while the substrate holder 18, gripped by the chuck claws 106 of the transporter 100, is moved horizontally at a predetermined speed. As shown in step 2, the receivers 118 of the lifting arms 116 stay (or wait) in a standby position at a predetermined height where the receivers 118 do not interfere with the first step portion 90 of the substrate holder 18, while the substrate holder 18 stops at a predetermined position just above the precleaning bath 32.

Next, as shown in step 3, the lifting arms 116 of the precleaning-bath immovable lifter 114 are elevated until the receivers 118 reach a substrate holder receiving position at which a minimal gap is formed between the receivers 118 and the first step portions 90. Solid lines of FIG. 8 illustrate the process of elevating the lifting arms 116 and transferring the substrate holder 18 from the transporter 100 to the precleaning-bath immovable lifter 114. The lifting arms 116 support the first step portions 90 of the holder hanger of the substrate holder 18. As shown in step 3, the receivers 118 can be elevated to the position which is slightly lower than the first step portions 90, because the lifting arms 116 are configured to support the substrate holder 18 from both sides of the substrate holder 18 and because a distance between the right and left lifting arms 116 is larger than a width of the first holding member 54 of the substrate holder 18.

Thereafter, as shown in step 4, the chuck claws 106 are opened to release the substrate holder 18 from the transporter 100, whereby the substrate holder 18 is received and held by the receivers 118 of the precleaning-bath immovable lifter 114. In order to reduce an impact on the substrate holder 18, the receivers 118 may have a shock-absorbing structure.

Next, as shown in step 5, the lifting arms 116 of the precleaning-bath immovable lifter 114 are lowered to thereby lower the receivers 118 and the substrate holder 18. After the hand lever 92 of the substrate holder 18 has been moved down below the chuck claws 106 of the transporter 100, the transporter 100 can move horizontally for the next processing step.

As shown in step 6, the receivers 118 are lowered until the substrate, held by the substrate holder 18, is immersed in the pretreatment liquid (e.g., pure water) in the precleaning bath 32. A speed of the descending receivers 118 may be set in consideration of prevention of splashing of the pretreatment liquid, prevention of entrainment of bubbles, etc. The substrate holder 18 is set at a predetermined position in the precleaning bath 32, where the substrate is subjected to the precleaning process. The substrate holder 18 is kept supported by the receivers 118 during the precleaning process (as shown by dashed-dotted lines in FIG. 8). Since the only one precleaning cell 32a is provided, the next substrate cannot be processed (precleaned) until the substrate holder 18, holding the precleaned substrate W, leaves the precleaning cell 32a. Therefore, the immovable lifter 114 for the precleaning bath 32 functions not only to elevate and lower the substrate holder 18 relative to the precleaning bath 32, but also to support the substrate holder 18 during precleaning of the substrate W.

An operational process of pulling up the substrate holder 18, holding the substrate W, out of the precleaning bath 32 and transferring the substrate holder 18 from the precleaning-bath immovable lifter 114 to the transporter 100 will now be described with reference to FIG. 10. As with FIG. 9, FIG. 10 schematically shows only the first step portion 90 and the hand lever 92 of the holder hanger of the substrate holder 18, the chuck claws 106 of the transporter 100, and one of the receivers 118 of the precleaning-bath immovable lifter 114.

Figure 10:
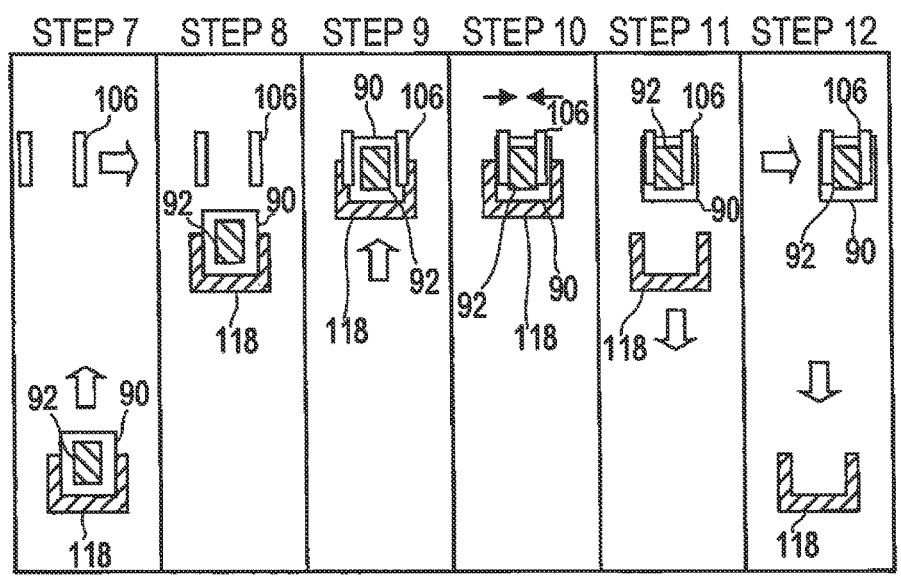
FIG. 10 is a schematic diagram illustrating an operational process of drawing up the substrate holder, holding the substrate, out of the precleaning bath and transferring the substrate holder from the precleaning-bath immovable lifter to the transporter.

First, as shown in step 7 of FIG. 10, the receivers 118 of the precleaning-bath immovable lifter 114 are elevated to thereby elevate the substrate holder 18, while the laterally-moving arm 104 of the transporter 100, not holding a substrate holder 18, is moved horizontally at its maximum speed. A speed of the ascending substrate holder 18 may be set at 100 mm/sec in view of a time for draining the processing liquid from the substrate holder 18. As shown in step 8, the receivers 118, supporting lower surfaces of the first step portions 90 of the substrate holder 18, stay in a standby position at a predetermined height, while the laterally-moving arm 104 of the transporter 100, not holding a substrate holder 18, stops at a predetermined position just above the precleaning bath 32.

Next, as shown in step 9, the lifting arms 116 of the precleaning-bath immovable lifter 114 are elevated until the receivers 118 reach a substrate holder transfer position. Thereafter, as shown in step 10, the chuck claws 106 are closed to grip (nip) the hand lever 92 of the substrate holder 18.

Next, as shown in step 11, the lifting arms 116 are lowered to lower the receivers 118 to the standby position, at which the receivers 118 stay until they receive the next substrate holder. The transporter 100, holding the substrate holder 18, moves the substrate holder 18 horizontally to the next processing bath as shown in step 12. During this operation, as shown in step 12, the lifting arms 116 may be lowered until the receivers 118 reach a lowest stop position.

It is preferred that the transporter 100 receive the substrate holder 18 simultaneously with the completion of the operation of drawing up the substrate holder 18 out of the precleaning bath 32, performed by the precleaning-bath immovable lifter 114, in order to avoid drying or oxidation of the substrate W that may occur when the substrate W is left in air. However, the transporter 100 sometimes cannot reach the precleaning bath 32 immediately, for example, when the transporter 100 is transporting another substrate holder or when the laterally-moving arm 104 of the transporter 100 is far from the precleaning bath 32. Thus, the controller 13 is configured to determine whether or not the transporter 100 can reach the precleaning bath 32 simultaneously with the completion of the operation of drawing up the substrate holder 18 out of the precleaning bath 32. This determination is performed based on preset amounts of time required for respective operations.

If it is determined that the transporter 100 can reach the precleaning bath 32, the precleaning-bath immovable lifter 114 immediately starts the operation of drawing up the substrate holder 18. The controller 13 controls a timing of starting the movement of the laterally-moving arm 104 so that the transporter 100 can reach the precleaning bath 32 by the time when the precleaning-bath immovable lifter 114 completes the operation of drawing up the substrate holder 18 out of the precleaning bath 32. If it is determined that the transporter 100 cannot reach the precleaning bath 32, the controller 13 calculates a time of starting the drawing of the substrate holder 18 based on an estimated time of arrival of the transporter 100 and based on a time required for drawing up the substrate holder 18. The precleaning-bath immovable lifter 114 stays without starting the drawing of the substrate holder 18 until the calculated drawing start time is reached. In this manner, the precleaning-bath immovable lifter 114 can start the operation of drawing up the substrate holder 18 from the precleaning bath 32 when the transporter 100 is transporting another substrate holder or traveling toward the precleaning bath 32. Therefore, it becomes possible to reduce the time required to transport the substrate holder 18 and can therefore increase a throughput.

The transporter 100 can transport only one substrate holder 18 at a time. Therefore, when processing of a plurality of substrates is completed simultaneously in a plurality of processing baths including the pretreatment bath 32, the controller 13 selects one processing bath from which the substrate holder 18 is to be drawn. Which to select from the processing baths is determined based on an allowable residence time for a substrate W after processing in each processing bath.

The determination as to whether the transporter 100 can reach the precleaning bath 32 simultaneously with the completion of the operation of drawing up the substrate holder 18 out of the precleaning bath 32 is performed based on (1) a time necessary for the laterally-moving arm 104 of the transporter 100 to reach the precleaning bath 32, (2) a time necessary for the immovable lifter 114 to draw up the substrate holder 18 out of the precleaning bath 32, etc. Such times are measured in advance and set as parameters in the controller 13. The determination is conducted when the pretreatment (precleaning) of the substrate W in the precleaning bath 32 is started or when the transporter 100 starts transporting another substrate holder.

Consequently, the immovable lifter 114 stops elevating the substrate holder 18 at the same time as the laterally-moving arm 104 of the transporter 100 reaches the precleaning bath 32. Therefore, when the substrate W is removed from the precleaning bath 32, the substrate holder 18 can be transferred from the immovable lifter 114 to the laterally-moving arm 104 of the transporter 100 smoothly without any loss of time.

A similar operational control is performed when setting the substrate holder 18 in the precleaning bath 32 by the precleaning-bath immovable lifter 114. Specifically, the receivers 118 of the precleaning-bath immovable lifter 114 start moving to the standby position at a pre-calculated movement start time. The controller 13 controls the timing of starting the operation of the immovable lifter 114 so that the receivers 118 can reach the standby position and stay there before the laterally-moving arm 104 of the transporter 100 reaches the precleaning bath 32.

Therefore, when placing the substrate W in the precleaning bath 32, the substrate holder 18 can be transferred from the transporter 100 to the immovable lifter 114 smoothly without any loss of time.

A similar operational control is also performed when transferring the substrate holder 18, holding the substrate W, from the transporter 100 to the immovable lifter 122 for the rinsing bath 36 and setting the substrate holder 18 at a predetermined position in the rinsing bath 36, and when transferring the substrate holder 18, holding the substrate W, from the transporter 100 to the immovable lifter 132 for the blow bath 38 and setting the substrate holder 18 at a predetermined position in the blow bath 38. Accordingly duplicated descriptions are omitted.

The immovable lifter 114 for the precleaning bath 32, the immovable lifter 122 for the rinsing bath 36, and the immovable lifter 132 for the blow bath 38 are each used for only one processing cell as described above. Therefore, these lifters are constructed as immovable-type lifters which do not move horizontally and only elevate and lower the substrate holder 18.

An operational process of transferring the substrate holder 18, holding the substrate W, from the transporter 100 to the plating-bath movable lifter 144 for the plating bath 34 and placing the substrate holder 18 at a predetermined position in the plating cell 34a of the plating bath 34 will now be described with reference to FIGS. 11 and 12. The plating bath 34 has a plurality of plating cells 34a. If an immovable lifter is provided for each plating cell, the number of immovable lifters increase and parts thereof also increase. In addition, a large number of immovable lifters may impede maintenance works, such as adjustment or replacement of parts in the plating cell 34a. The use of a movable lifter as in this embodiment can simplify the apparatus and secure a sufficient maintenance space.

Figure 11:
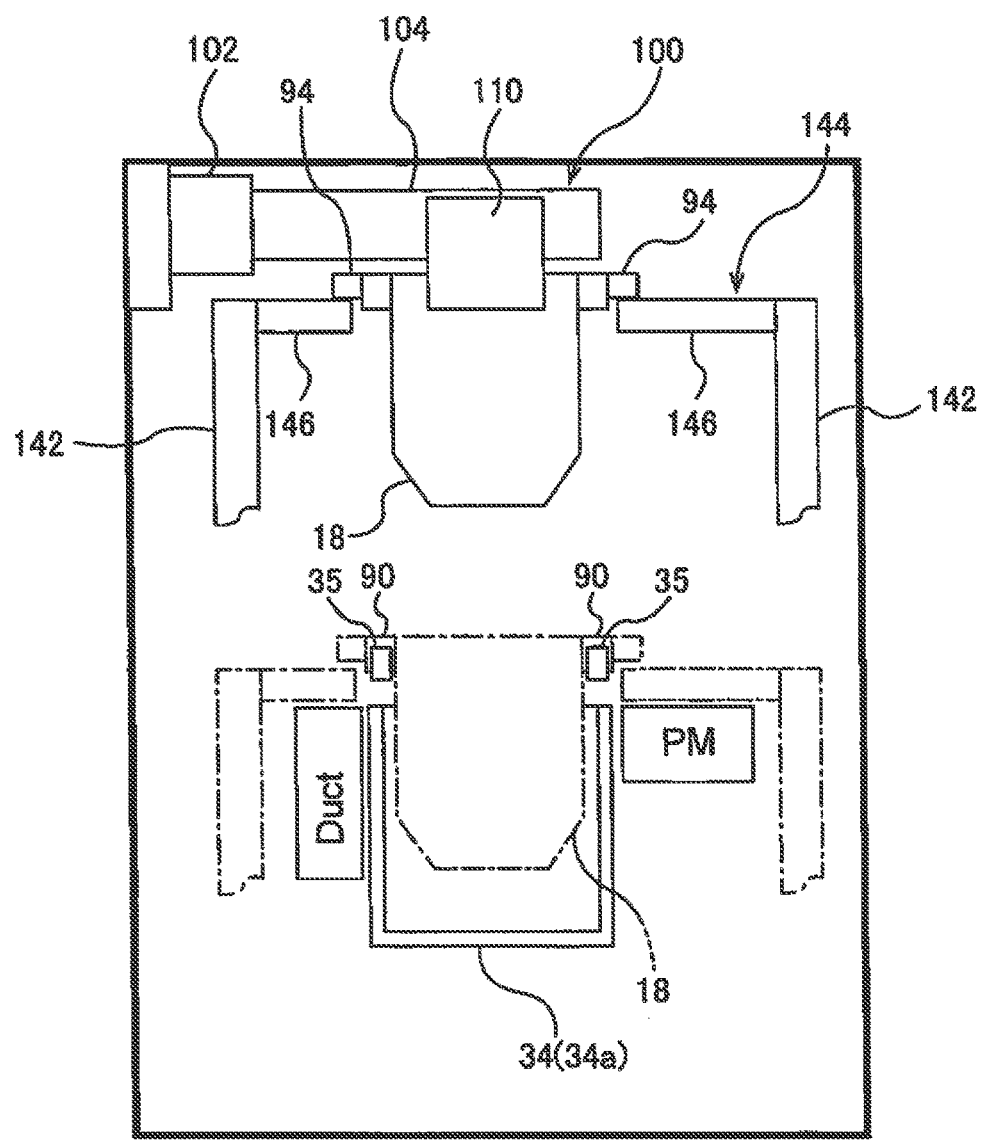
FIG. 11 is a schematic diagram illustrating the transporter when transferring the substrate holder to a plating-bath movable lifter.

Solid lines of FIG. 11 illustrate the process of elevating the lifting arms 146 of the plating-bath movable lifter 144 to a substrate holder receiving position and transferring the substrate holder 18 from the transporter 100 to the plating-bath movable lifter 144. The lifting arms 146 support the second step portions 94 of the holder hanger of the substrate holder 18. In FIG. 11, the receivers 148 mounted to the lifting arms 146 are not shown. Dashed-dotted lines in FIG. 11 illustrate the substrate holder 18, holding the substrate W, when the substrate holder 18 is lowered by the movable lifter 144 until the substrate holder 18 is immersed in the plating solution in the plating cell 34a.

Figure 12:
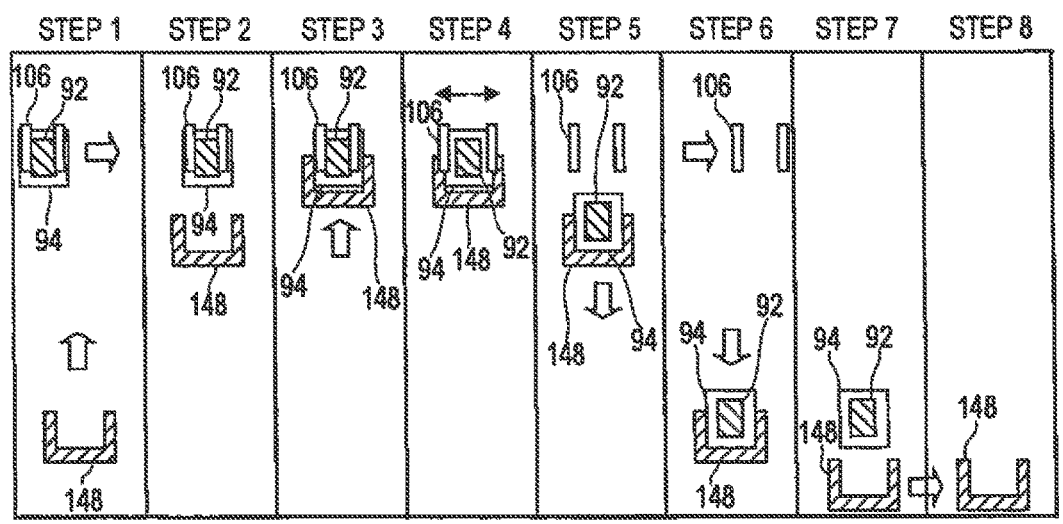
FIG. 12 is a schematic diagram illustrating an operational process of transferring the substrate holder, holding the substrate, from the transporter to the plating-bath movable lifter and placing the substrate holder at a predetermined position in a plating cell of a plating bath.

FIG. 12 schematically shows only the second step portion 94 and the hand lever 92 of the holder hanger of the substrate holder 18, the chuck claws 106 of the transporter 100, and one of the receivers 148 of the plating-bath movable lifter 144.

First, as shown in step 1 of FIG. 12, the elevating actuator 142 of the plating-bath movable lifter 144 is moved horizontally by the laterally-moving actuators 140 to thereby move the receivers 148 to a position beside a predetermined plating cell 34a. The receivers 148 are then elevated by the elevating actuator 142, while the substrate holder 18 is moved horizontally at a predetermined speed by the transporter 100. As shown in step 2, the receivers 148 of the plating-bath movable lifter 144 stay in a standby position at a predetermined height where the receivers 148 do not interfere with the second step portions 94 of the holder hanger of the substrate holder 18. The substrate holder 18, gripped by the transporter 100, stops at a predetermined position just above the plating cell 34a.

Next, as shown in step 3, the lifting arms 146 of the plating-bath movable lifter 144 are elevated until the receivers 148 reach a substrate holder receiving position. The solid lines of FIG. 11 illustrate the process of elevating the receivers 148 of the plating-bath movable lifter 144 to the substrate holder receiving position and transferring the substrate holder 18 from the transporter 100 to the plating-bath movable lifter 144. Thereafter, as shown in step 4, the chuck claws 106 are opened to release the substrate holder 18 from the transporter 100, whereby the substrate holder 18 is received and held by the receivers 148 of the plating-bath movable lifter 144. As with the receivers 118 of the precleaning-bath immovable lifter 114, the receivers 148 of the plating-bath movable lifter 144 may have a shock-absorbing structure.

Next, as shown in step 5, the lifting arms 146 of the movable lifter 144 are lowered to thereby lower the receivers 148. As described above with reference to the operation of the precleaning-bath immovable lifter 114, the transporter 100 can move horizontally for the next substrate processing after the hand lever 92 of the substrate holder 18 has been moved down below the chuck claws 106 of the transporter 100.

As shown in step 6, the receivers 148 are lowered until the substrate, held by the substrate holder 18, is immersed in the plating solution held in the plating cell 34a. A speed of the descending receivers 148 may be set in consideration of prevention of splashing of the plating solution, prevention of entrainment of bubbles, etc. The first step portions 90 of the holder hanger of the substrate holder 18 come into contact with a pair of plating-bath-side receivers 35, shown in FIG. 11, provided at both sides of the plating cell 34a, so that the plating-bath-side receivers 35 support the substrate holder 18. The substrate holder 18 is thus set at a predetermined position in the plating cell 34a. The plating-bath-side receivers 35 each have an open-top shape having a bottom portion and a pair of opposing side portions, as well as the receivers 148. The plating-bath-side receivers 35 are not shown in FIG. 6.

Thereafter, as shown in step 7, the receivers 148 are further lowered and stopped at a lowest stop position. As necessary, as shown in step 8, the receivers 148 may be moved horizontally, together with the elevating actuators 142, by the laterally-moving actuators 140 to a position beside another plating cell 34a from which a substrate holder, holding a plated substrate, is to be removed.

Figure 13:
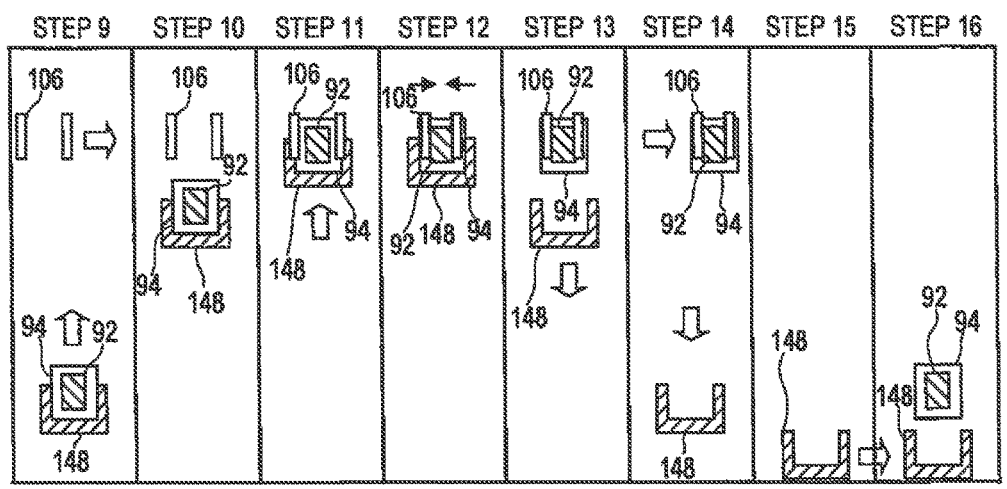
FIG. 13 is a schematic diagram illustrating an operational process of drawing up the substrate holder, holding the substrate, out of the plating cell and transferring the substrate holder from the plating-bath movable lifter to the transporter.

An operational process of drawing up the substrate holder 18, holding a substrate, out of the plating cell 34a of the plating bath 34 and transferring the substrate holder 18 from the plating-bath movable lifter 144 to the transporter 100 will now be described with reference to FIG. 13. FIG. 13 schematically shows only the second step portion 94 and the hand lever 92 of the holder hanger of the substrate holder 18, the chuck claws 106 of the transporter 100, and one of the receivers 148 of the plating-bath movable lifter 144.

First, as shown in step 8 of FIG. 12, the receivers 148 are moved laterally, together with the elevating actuators 142, by the laterally-moving actuators 140 to a position located beside the plating cell 34a from which the substrate holder 18, holding a plated substrate, is to be removed and located below the plating-bath-side receivers 35. Thereafter, as shown in step 9 of FIG. 13, the receivers 148 of the plating-bath movable lifter 144 are elevated to support lower surfaces of the second step portions 94 of the holder hanger of the substrate holder 18 to elevate the substrate holder 18. A speed of the ascending substrate holder 18 may be set at 30 to 200 mm/sec. The laterally-moving arm 104 of the transporter 100 that does not hold a substrate holder is moved horizontally at its maximum speed. As shown in step 10, the receivers 148, supporting the substrate holder 18, stay in the standby position at a predetermined height, while the chuck claws 106 of the transporter 100 with no substrate holder stop at a predetermined position just above the plating cell 34a.

Next, as shown in step 11, the lifting arms 146 of the movable lifter 144 are elevated until the receivers 148 reach a substrate holder transfer position. Thereafter, as shown in step 12, the chuck claws 106 are closed to grip (nip) the hand lever 92 of the substrate holder 18.

Next, as shown in step 13, the lifting arms 146 of the movable lifter 144 are lowered to lower the receivers 148 to the standby position, at which the receivers 148 stay until the receivers 148 receive the next substrate holder. The transporter 100, holding the substrate holder 18, moves the substrate holder 18 horizontally to the next processing bath as shown in step 14.

If there is no substrate to be plated, then the receivers 148 are moved to a position located beside a plating cell in which plating is expected to be completed next and located below the plating-bath-side receivers 35, and the receivers 148 stay at that position, as shown in steps 15, 16.

According to the plating-bath movable lifter 144 having the above-described construction, elevating and lowering of the substrate holder 18, which have ever been performed by a transporter, can be performed at any one of the plurality of plating cells 34a by horizontally moving the pair of elevating actuators 142 by the laterally-moving actuators 140. In the case of a plating bath having a small number of plating cells, e.g., two plating cells, it is also possible to use an immovable lifter having a selection mechanism, such as an actuator, which makes it possible to selectively hold a substrate holder.

The transporter 100 is preferably installed on the ceiling-side wall of the plating apparatus. This arrangement can increase a space efficiency although the assembly and adjustment of the transporter 100 may be somewhat more troublesome. The elevating actuators 142 of the plating-bath movable lifter 144 may preferably be disposed away from the plating bath 34, so that a splashing plating solution is less likely to be attached to the elevating actuators 142.

The storage-unit movable lifter 154 for the storage unit 30 has a construction similar to that of the plating-bath movable lifter 144. The storage unit 30 is provided with a plurality of storage-unit-side receivers that support the first step portions 90 of substrate holders 18. These substrate holders 18 are stored in a suspended position in parallel arrangement in the storage unit 30. The operation of taking out the substrate holder 18 from the storage unit 30 is performed as follows. First, the laterally-moving actuators 150 are driven to move receivers (not shown), mounted to the lifting arms, to a position beside the substrate holder 18 to be taken out from the storage unit 30. Next, the elevating actuators 152 are driven so that the receivers support the second step portions 94 of the holder hanger of the substrate holder 18 to elevate the substrate holder 18. By thus horizontally moving the pair of elevating actuators 152 by the laterally-moving actuators 150, elevating and lowering of the substrate holder 18, which have ever been performed by a transporter, can be performed at any storage position in the storage unit 30.

Figure 14:
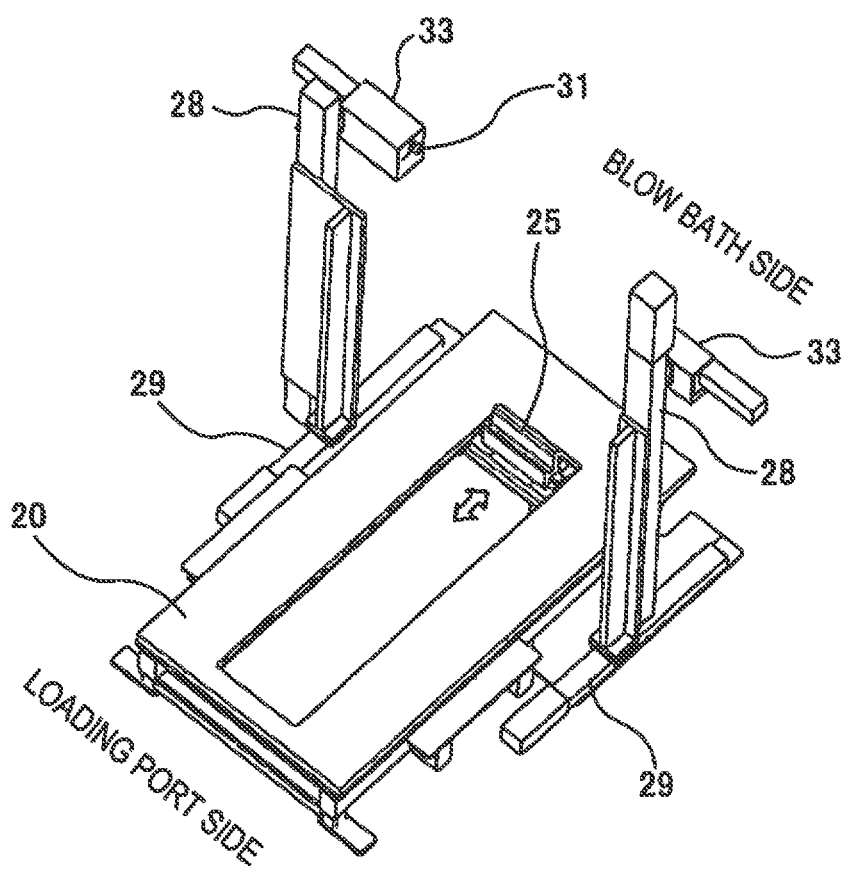
FIG. 14 is a perspective view of a substrate-holder tilting mechanism.
Figure 15:
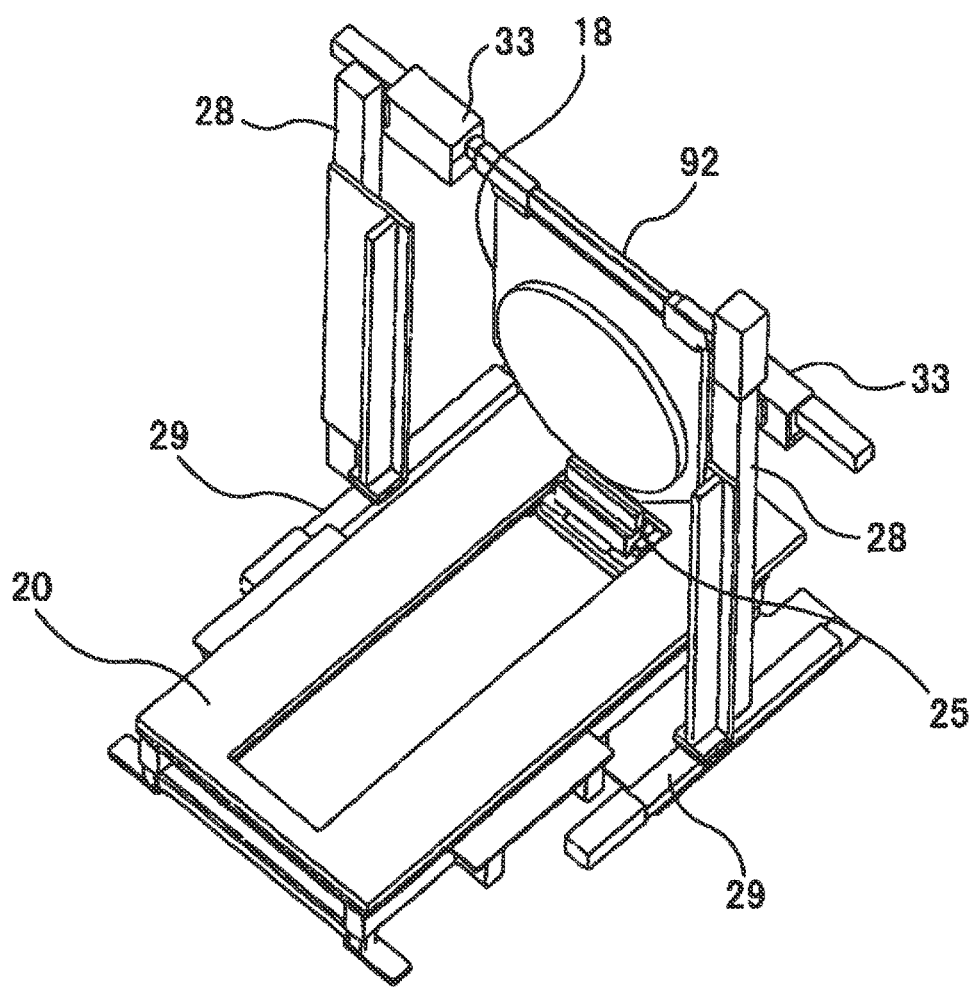
FIG. 15 is a diagram showing the substrate-holder tilting mechanism when rotatably supporting the substrate holder.

FIG. 14 is a perspective view of the substrate-holder tilting mechanism 26. As shown in FIG. 14, the substrate-holder tilting mechanism 26 includes a pair of elevating actuators 28 installed upright at both sides of the table 20, a pair of laterally-moving actuators 29 for horizontally moving the elevating actuators 28, and a pair of support pins (support members) 31 that are moved vertically by the elevating actuators 28. The support pins 31 are moved by pin actuators 33 in directions closer to and away from each other. As shown in FIG. 15, the support pins 31 are inserted into pin insertion holes 95 (see FIGS. 2 and 3) formed in side surfaces of the second step portions 94 of the substrate holder 18, so that the substrate-holder tilting mechanism 26 can rotatably support the substrate holder 18. The table 20 is provided with a slider 25 which is slidable in directions indicated by arrows shown in FIG. 14.

The transporter 100 holds the substrate holder 18 by nipping the hand lever 92 of the substrate holder 18 with the chuck claws 106. The transporter 100 moves the substrate holder 18 to a position where the support pins 31 in an elevated position can be inserted into the pin insertion holes 95 of the substrate holder 18. The support pins 31 are then advanced by the pin actuators 33 and inserted into the pin insertion holes 95 (see FIG. 15).

Figure 16:
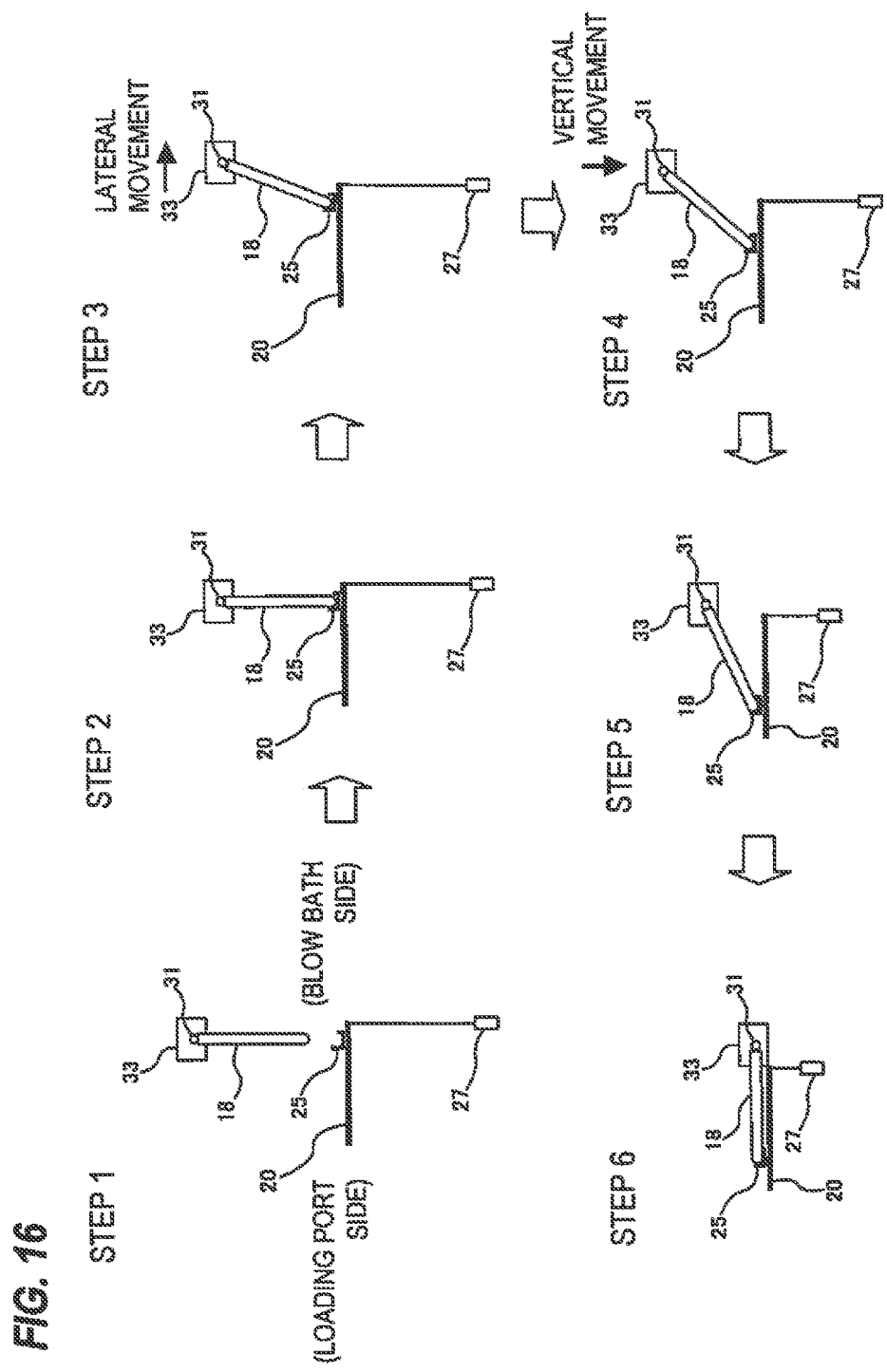
FIG. 16 is a diagram illustrating an operational process of bringing down the substrate holder into a horizontal position and placing the substrate holder on a table by the substrate-holder tilting mechanism.

FIG. 16 is a diagram illustrating an operational process of bringing down the substrate holder 18, with a plated substrate, into a horizontal position and placing the substrate holder 18 on the table 20 by the substrate-holder tilting mechanism 26. In step 1, the chuck claws 106 of the transporter 100 are opened to release the hand lever 92 of the substrate holder 18. In step 2, the substrate holder 18, supported by the support pins 31, is lowered by the elevating actuators 28 to bring a distal end of the substrate holder 18 into contact with a receiving surface of the slider 25. Because the hand lever 92 of the substrate holder 18 descends below the chuck claws 106 of the transporter 100 as the substrate holder 18 is lowered, the transporter 100 can move horizontally for the next substrate processing.

Figure 17:
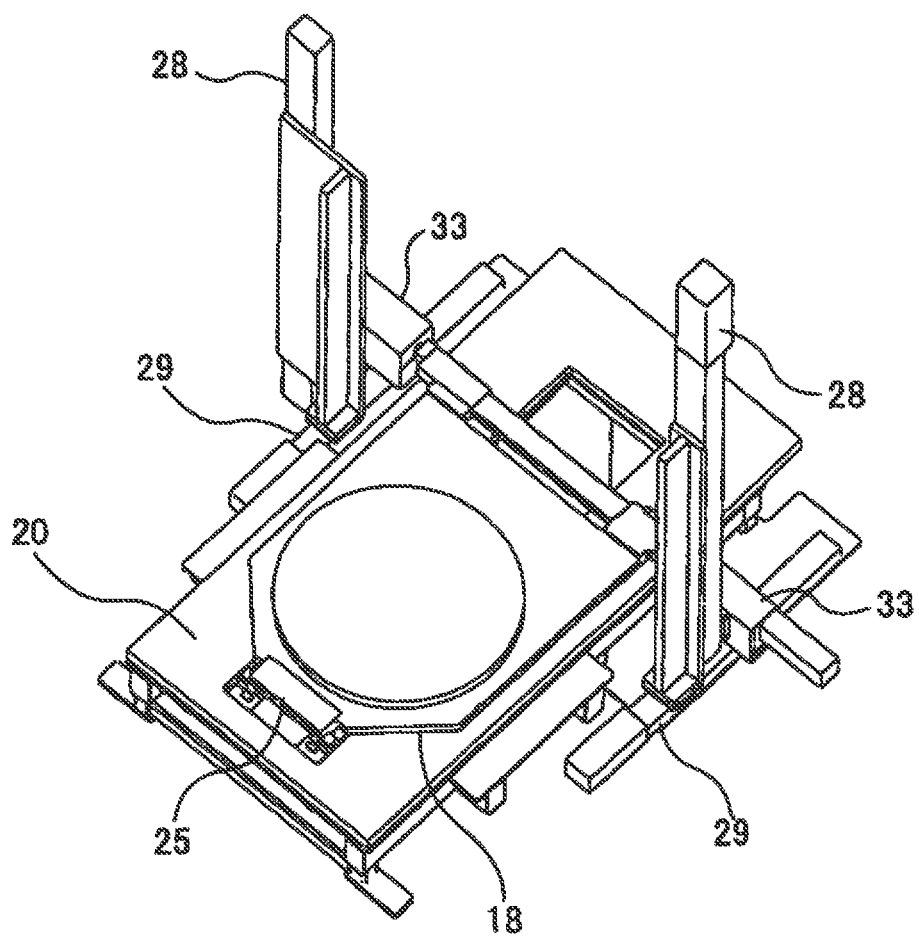
FIG. 17 is a diagram showing the substrate holder in the horizontal position.

As shown in steps 3, 4, the laterally-moving actuators 29 and the elevating actuators 28 are operated in synchronization to further move the support pine 31 downward. As the support pins 31 move downward, the substrate holder 18 rotates about the support pins 31, so that the substrate holder 18 is inclined from the vertical direction. The laterally-moving actuators 29 and the elevating actuators 28 are operated in synchronization such that the distal end of the substrate holder 18 is not separated from the slider 25. The slider 25 is biased toward the blow bath 38 by a weight 27. As the support pins 31 are further lowered by the elevating actuators 28, the slider 25 slides toward the loading ports 12 and the substrate holder 18 is further inclined (step 5) until the substrate holder 18 becomes a horizontal position (step 6). FIG. 17 is a diagram showing the substrate holder 18 in the horizontal position. The slider 25 itself is configured to be rotatable so that the distal end of the substrate holder 18 is not separated from the slider 25. It is also possible to move the slider 25 by another actuator while controlling the movement of the slider 25.

As shown in FIG. 1, the substrate-holder opening and closing mechanism 24 for locking the second holding member (movable holding member) 58 of the substrate holder 18 to the first holding member (base holding member) 54 is provided above the table 20. After plating of a substrate, the second holding member 58 is unlocked by the substrate-holder opening and closing mechanism 24, and the substrate is then removed from the substrate holder 18 by the substrate transfer robot 22.

After a new substrate to be plated is held by the substrate holder 18, the elevating actuators 28 elevate the support pins 31 again so as to return the substrate holder 18 to the vertical position. The horizontal position of the laterally-moving arm 104 of the transporter 100 is adjusted so that the chuck claws 106 of the transporter 100 can hold the hand lever 92 of the substrate holder 18 when the support pins 31 are in the elevated position. Because the slider 25 is biased toward the blow bath 38, the slider 25 follows the movement of the substrate holder 18 without being disengaged from the distal end of the substrate holder 18. After the chuck claws 106 of the transporter 100 grip the hand lever 92, the support pins 31 are moved backward to allow the substrate holder 18 to be transferred to the transporter 100.

A plating process performed by the plating apparatus having the above-described construction will now be described. First, the substrate holder 18, stored in a vertical position in the storage unit 30, is held and elevated by the storage-unit movable lifter 154, and is transferred to the laterally-moving arm 104 of the transporter 100. The laterally-moving arm 104, gripping the substrate holder 18 with the chuck claws 106, moves horizontally and transfers the substrate holder 18 to the substrate-holder tilting mechanism 26. While supporting the substrate holder 18 with the support pins 31, the substrate-holder tilting mechanism 26 converts the substrate holder 18 from the vertical position to the horizontal position and places the substrate holder 18 on the table 20 in the above-described manner. The substrate holder 18 on the table 20 is left open.

The substrate transfer robot 22 takes one substrate out of the cassette mounted in one of the loading ports 12, and places the substrate on the aligner 14. The aligner 14 aligns an orientation flat or a notch with a predetermined direction. Thereafter, the substrate transfer robot 22 removes the substrate from the aligner 14, and inserts the substrate into the substrate holder 18 that is placed on the table 20. Thereafter, the substrate holder 18 is closed, and then the substrate holder 18 is locked by the substrate-holder opening and closing mechanism 24.

Next, the substrate-holder tilting mechanism 26 elevates the pair of support pins 31 (see FIG. 14) by the actuators 28 so as to convert the substrate holder 18 from the horizontal position to the vertical position. The laterally-moving arm 104 of the transporter 100 grips the upright substrate holder 18 and moves the substrate holder 18 horizontally, and transfers the substrate holder 18 to the precleaning-bath immovable lifter 114. The precleaning-bath immovable lifter 114 then lowers the substrate holder 18 and sets it at a predetermined position in the precleaning bath 32, where the substrate is subjected to precleaning. After the precleaning of the substrate is terminated, the precleaning-bath immovable lifter 114 elevates the substrate holder 18 and transfers it to the laterally-moving arm 104 of the transporter 100.

The laterally-moving arm 104 of the transporter 100 moves horizontally and transfers the substrate holder 18 to the plating-bath movable lifter 144. The plating-bath movable lifter 144 then lowers the substrate holder 18 and sets it on the plating-bath-side receivers in one of the plating cells 34a of the plating bath 34, where the substrate is plated. After plating of the substrate is terminated, the plating-bath movable lifter 144 elevates the substrate holder 18 and transfers it to the laterally-moving arm 104 of the transporter 100.

The laterally-moving arm 104 of the transporter 100 moves horizontally and transfers the substrate holder 18 to the rinsing-bath immovable lifter 122. The rinsing-bath immovable lifter 122 then lowers the substrate holder 18 and sets it at a predetermined position in the rinsing bath 36, where the plated substrate is rinsed. After the rinsing of the substrate is terminated, the rinsing-bath immovable lifter 122 elevates the substrate holder 18 and transfers it to the laterally-moving arm 104 of the transporter 100.

The laterally-moving arm 104 of the transporter 100 moves horizontally and transfers the substrate holder 18 to the blow-bath immovable lifter 132. The blow-bath immovable lifter 132 then lowers the substrate holder 18 and sets it at a predetermined position in the blow bath 38, where the air blows the substrate to remove water droplets from the surface of the substrate, thereby drying the substrate surface. After the blowing of the substrate is terminated, the blow-bath immovable lifter 132 elevates the substrate holder 18 and transfers it to the laterally-moving arm 104 of the transporter 100.

The laterally-moving arm 104 of the transporter 100 moves horizontally and transfers the substrate holder 18 to the substrate-holder tilting mechanism 26. The substrate-holder tilting mechanism 26 converts the substrate holder 18 to the horizontal position and places it on the table 20 in the above-described manner. The substrate transfer robot 22 removes the processed substrate from the substrate holder 18, and transports the substrate to the spin-rinse drier 16. The spin-rinse drier 16 rotates the substrate at a high speed to dry the substrate. The substrate transfer robot 22 removes the dried substrate from the spin-rinse drier 16 and returns the substrate to the cassette in the loading port 12, thereby completing the process of the substrate.

It is possible to sequentially place substrate holders 18 in all of the plating cells and carry out plating of substrates successively. In this case, first, the plating-bath movable lifter 144 sets the substrate holder 18 in one plating cell 34a, and then moves the receivers 148 to a position beside the next plating cell 34a and receives the next substrate holder 18. Upon completion of plating in the one plating cell 34a, the movable lifter 144 elevates the substrate holder 18 from that plating cell 34a. The receivers 148 stay there until the next substrate holder 18 is transported to the plating cell 34a. If there is no substrate to be newly plated, the movable lifter 144 elevates the substrate holder 18 holding a plated substrate, and then moves the receivers 148 to a position beside another plating cell 34a where plating is expected to be terminated next, and the receivers 148 stay in that position. In this manner, plating of substrates is performed in a successive manner.

Figure 18:
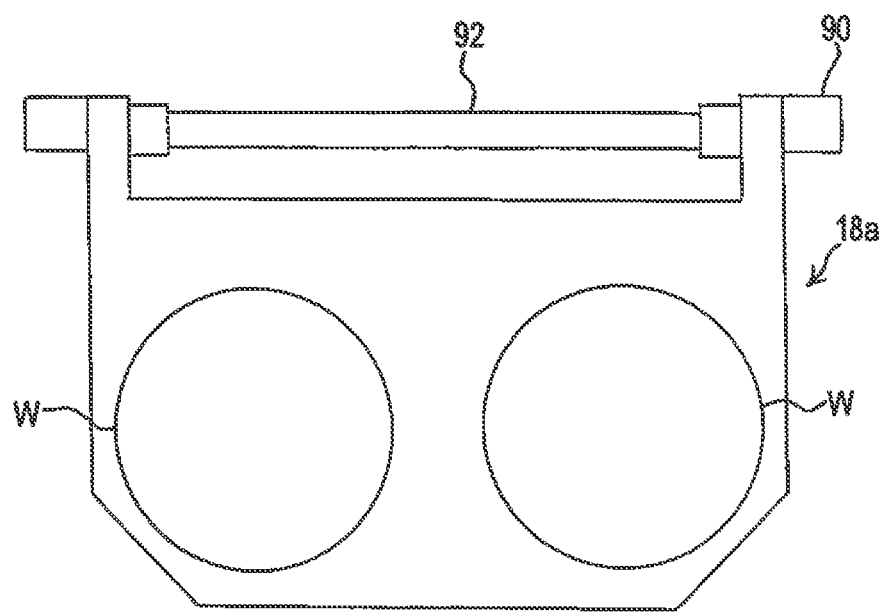
FIG. 18 is a plan view of another example of the substrate holder.

FIG. 18 schematically shows another type of substrate holder 18a. This type of substrate holder 18a is configured to simultaneously hold two substrates W side-by-side in a lateral direction. The use of the substrate holder 18a that simultaneously holds two substrates W can approximately double the throughput. When processing only one substrate, a dummy substrate may be held, together with the substrate to be processed, by the substrate holder 18a. The dummy substrate may be stored above the aligner 14.

Figure 19:
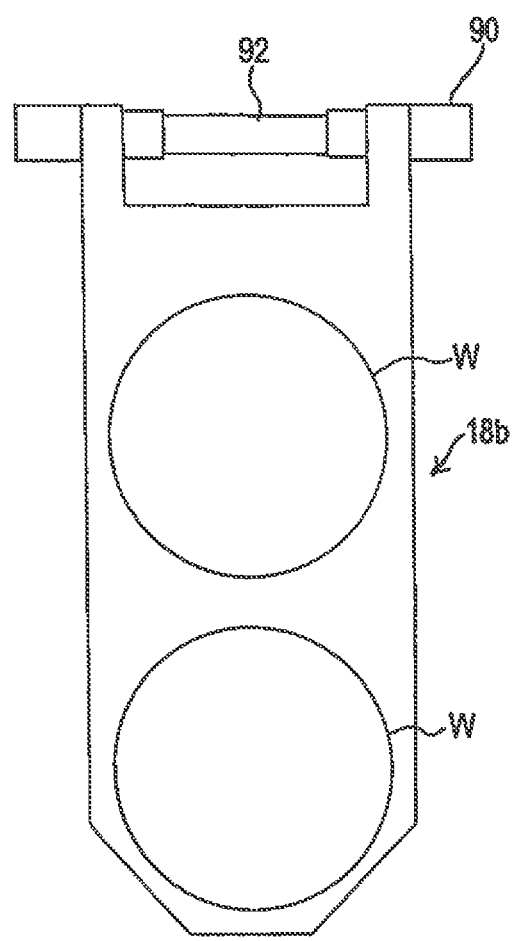
FIG. 19 is a plan view of yet another example of the substrate holder.

FIG. 19 schematically shows yet another type of substrate holder 18b. This type of substrate holder 18b is configured to simultaneously hold two substrates W side-by-side in a vertical direction. The use of the substrate holder 18b can also approximately double the throughput.

Figure 20:
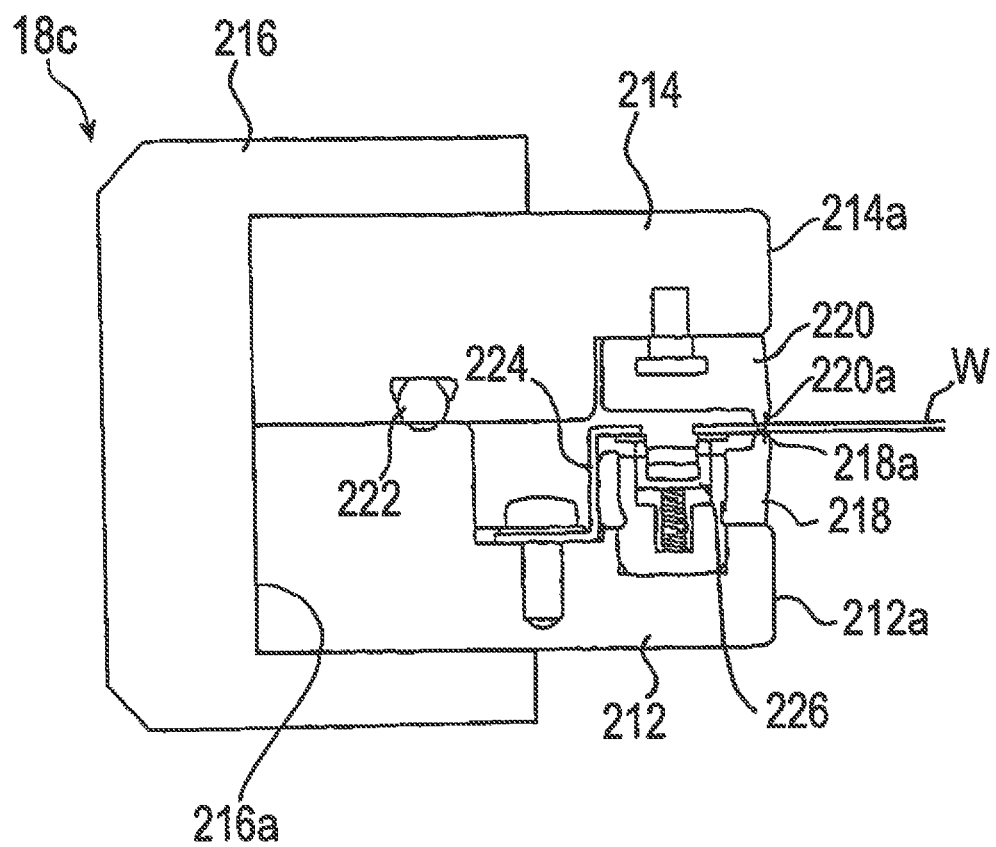
FIG. 20 is an enlarged view of a main portion of the substrate holder holding a substrate.

FIG. 20 is an enlarged view of a main portion of yet another substrate holder 18c holding a substrate W. As shown in FIG. 20, the substrate holder 18c includes a plate-shaped first holding member 212 and a plate-shaped second holding member 214, which are made of a resin material (e.g., HTPVC) and are openable/closable through a hinge (not shown). The first holding member 212 has an open hole 212a, and the second holding member 214 has an open hole 214a. The first holding member 212 and the second holding member 214, when they are in the closed state (overlapped state) through the hinge, are held by a pair of clamps 216. The clamps 216 are configured to be openable and closable, and are formed of a resin material (e.g., HTPVC).

A seal ring 218, which extends along the open hole 212a, is mounted to the first holding member 212. The seal ring 218 is disposed opposite the second holding member 214. A seal ring 220, which extends along the open hole 214a, is mounted to the second holding member 214. The seal ring 220 is disposed opposite the first holding member 212. The seal rings 218, 220 are made of a rubber material (e.g., silicone rubber or fluororubber). An O-ring 222 is mounted on a surface of the second holding member 214 which faces the first holding member 212. The O-ring 222 is located at the outer side of the seal ring 220.

The seal rings 218, 220 have annular sealing portions 218a, 220a, respectively, in their inner peripheral portions. These sealing portions 218a, 220a extend along the open holes 212a, 214a, respectively, and are disposed opposite each other. When the first holding member 212 and the second holding member 214 are in the overlapped state with the substrate W interposed between these holding members 212, 214, the sealing portions 218a, 220a press against a peripheral portion of the substrate W from both sides of the substrate W. A space surrounded by the sealing portions 218a, 220a and the O-ring 222 provides a watertight space which does not allow intrusion of a plating solution thereinto.

The first holding member 212 is provided with a plurality of conductive plates 224. These conductive plates 224 are located in the above-described watertight space. Half of the conductive plates 224 are electrically connected to one surface (e.g., a front surface) of the substrate W via conductive pins 226, while the other half of the conductive plates 224 are electrically connected to the other surface (e.g., a back surface) of the substrate W via conductive pins 226. The conductive plates 224 are electrically connected to a connection terminal provided on a hand (not shown) of the substrate holder 18c.

The substrate W is placed at a predetermined position in the first holding member 212 when the first holding member 212 and the second holding member 214 are opened. Thereafter, the first holding member 212 and the second holding member 214 are closed through the hinge, and the pair of clamps 216 are rotated until the first holding member 212 and the second holding member 214 are inserted into a groove 216a of the clamps 216. The substrate W is thus held by the first holding member 212 and the second holding member 214.

When the substrate W is held by the first holding member 212 and the second holding member 214, the space surrounded by the sealing portions 218a, 220a of the seal rings 218, 220 and the O-ring 222 is hermetically sealed to form the watertight space that does not allow the plating solution to enter. A portion of the substrate W, lying at the outer side of the sealing portions 218a, 220a, is located in this sealed space, while a portion of the substrate W, lying at the inner side of the sealing portions 218a, 220a, contacts the plating solution. The conductive plates 224 are connected to an external electrode extending from the hand.

The substrate holder 18c of this embodiment can hold the substrate W with both the front surface and the back surface exposed. This structure makes it possible to perform plating of the front and back surfaces of the substrate simultaneously. The use of the substrate holder 18c of this embodiment also makes it possible to stack two substrates together with the back surfaces facing each other, and to perform plating of the front surfaces of the stacked substrates by bringing the front surfaces into contact with a plating solution.

It is understood that the present invention is not limited to the embodiments described above, but is capable of various changes and modifications within the scope of the inventive concept as expressed herein.

What is claimed is:

1. A plating apparatus comprising:
   a substrate holder configured to hold a substrate in a vertical position;
   a processing bath configured to process the substrate held by the substrate holder;
   a substrate-holder tilting mechanism including
   (i) a support member configured to rotatably support the substrate holder, and
   (ii) an elevating actuator supporting the support member, the elevating actuator being configured to lower the support member to convert the substrate holder from the vertical position to a horizontal position and elevate the support member to convert the substrate holder from the horizontal position to the vertical position; and
   a transporter having a laterally-moving arm which is separated from the support member and the elevating actuator and is horizontally movable independently of the support member and the elevating actuator, the laterally-moving arm being configured to grip the substrate holder and horizontally transport the substrate holder between the processing bath and the substrate-holder tilting mechanism.

2. The plating apparatus according to claim 1, wherein the substrate-holder tilting mechanism further includes a laterally-moving actuator configured to move the elevating actuator horizontally.

3. The plating apparatus according to claim 1, wherein the substrate-holder tilting mechanism further includes a slider capable of contacting a distal end of the substrate holder and capable of sliding horizontally.

4. The plating apparatus according to claim 1, wherein the substrate-holder tilting mechanism further includes a support-member actuator configured to move the support member toward the substrate holder to establish an engagement between the support member and the substrate holder.

5. The plating apparatus according to claim 2, wherein the elevating actuator is coupled to the laterally-moving actuator.

6. The plating apparatus according to claim 2, wherein the elevating actuator is supported by the laterally-moving actuator.

* * * * *